US008894458B2

(12) United States Patent
Song et al.

(10) Patent No.: US 8,894,458 B2
(45) Date of Patent: Nov. 25, 2014

(54) THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

(75) Inventors: Jung-Bae Song, Yongin (KR); Beohm-Rock Choi, Yongin (KR); Sang-Pil Lee, Yongin (KR); Young-Rok Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 530 days.

(21) Appl. No.: 13/093,707

(22) Filed: Apr. 25, 2011

(65) Prior Publication Data
US 2011/0266944 A1 Nov. 3, 2011

(30) Foreign Application Priority Data

Apr. 28, 2010 (KR) .................. 10-2010-0039496
Apr. 5, 2011 (KR) .................. 10-2011-0031288

(51) Int. Cl.
*H01J 9/00* (2006.01)

(52) U.S. Cl.
USPC ............................................ 445/24; 313/504

(58) Field of Classification Search
USPC ...................................... 445/24, 25; 313/504
See application file for complete search history.

(56) References Cited

U.S. PATENT DOCUMENTS

| 4,416,217 A | 11/1983 | Nakamura et al. |
| 4,468,648 A | 8/1984 | Uchikune |
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |

(Continued)

FOREIGN PATENT DOCUMENTS

| CN | 1476279 A | 2/2004 |
| CN | 1489419 A | 4/2004 |

(Continued)

OTHER PUBLICATIONS

U.S. Office action dated Mar. 23, 2012, for cross reference U.S. Appl. No. 12/849,193, 17 pages.

(Continued)

*Primary Examiner* — Mary Ellen Bowman
(74) *Attorney, Agent, or Firm* — Christie, Parker & Hale, LLP

(57) ABSTRACT

Each of thin film deposition assemblies of a thin film deposition apparatus includes: a deposition source that includes a deposition material; a deposition source nozzle unit arranged at a side of the deposition source and including a plurality of deposition source nozzles arranged in a first direction; a patterning slit sheet arranged opposite to the deposition source nozzle unit and having a plurality of patterning slits arranged in the first direction; and a barrier plate assembly including a plurality of barrier plates arranged in the first direction, the barrier plate assembly being arranged between the deposition source nozzle unit and the patterning slit sheet. The thin film deposition apparatus and the substrate are separated from each other and are movable relative to each other. The deposition material includes a material to produce the thin film of a red (R), green (G) or blue (B) emission layer, or an auxiliary layer.

18 Claims, 13 Drawing Sheets

(56) References Cited

U.S. PATENT DOCUMENTS

| | | |
|---|---|---|
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1* | 8/2004 | Morii ............................ 430/321 |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1* | 2/2006 | Liao et al. ..................... 428/690 |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |

(56) References Cited

U.S. PATENT DOCUMENTS

| | | |
|---|---|---|
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0272689 A1 | 11/2008 | Ide et al. |
| 2008/0286461 A1 | 11/2008 | Noguchi et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0261360 A1 | 10/2009 | Yasukawa et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |

FOREIGN PATENT DOCUMENTS

| | | |
|---|---|---|
| CN | 1500904 | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 A2 | 11/1982 |
| JP | 2-247372 | 10/1990 |
| JP | 04-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 09-095776 | 4/1997 |
| JP | 10-050478 | 2/1998 |
| JP | 10-120171 | 5/1998 |
| JP | 10-270535 | 10/1998 |
| JP | 11-144865 | 5/1999 |
| JP | 2000-068054 | 3/2000 |
| JP | 2000-282219 | 10/2000 |
| JP | 2000-323277 | 11/2000 |
| JP | 2001-28325 A2 | 1/2001 |
| JP | 2001-052862 | 2/2001 |
| JP | 2001-093667 | 4/2001 |
| JP | 2002-75638 A2 | 3/2002 |
| JP | 2002-175878 | 6/2002 |

(56) References Cited

FOREIGN PATENT DOCUMENTS

| | | |
|---|---|---|
| JP | 2002-348659 | 12/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 A2 | 11/2003 |
| JP | 2003-347394 A2 | 12/2003 |
| JP | 2004-035964 A2 | 2/2004 |
| JP | 2004-043898 | 2/2004 |
| JP | 2004-076150 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 | 5/2004 |
| JP | 2004-143521 | 5/2004 |
| JP | 2004-169169 A2 | 6/2004 |
| JP | 2004-199919 | 7/2004 |
| JP | 2004-225058 | 8/2004 |
| JP | 2004-238688 A | 8/2004 |
| JP | 2004-342455 A2 | 12/2004 |
| JP | 2004-349101 | 12/2004 |
| JP | 2004-355975 A | 12/2004 |
| JP | 2005-044592 | 2/2005 |
| JP | 2005-101505 | 4/2005 |
| JP | 2005-122980 A2 | 5/2005 |
| JP | 2005-163099 | 6/2005 |
| JP | 2005-165015 A2 | 6/2005 |
| JP | 2005-174843 A2 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A2 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-047293 | 2/2007 |
| JP | 2007/066862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 A2 | 5/2008 |
| JP | 2008-121098 | 5/2008 |
| JP | 2008-521165 A2 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-019243 | 1/2009 |
| JP | 2009-24208 A2 | 2/2009 |
| JP | 2009-049223 | 3/2009 |
| JP | 2009-81165 A2 | 4/2009 |
| JP | 2009-087910 | 4/2009 |
| JP | 2009-117231 A2 | 5/2009 |
| JP | 2009-181755 A | 8/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 | 4/2000 |
| KR | 10-2000-0023929 | 5/2000 |
| KR | 2001-0024652 A | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 10-2002-0001555 | 1/2002 |
| KR | 2002-0025760 | 4/2002 |
| KR | 10-2002-0050922 | 6/2002 |
| KR | 10-2002-0090934 | 12/2002 |
| KR | 10-2002-0091457 A | 12/2002 |
| KR | 2003-0001745 A | 1/2003 |
| KR | 2003-0034730 A | 5/2003 |
| KR | 10-2003-0043012 A | 6/2003 |
| KR | 2003-0046090 A | 6/2003 |
| KR | 2003-0069684 A | 8/2003 |
| KR | 10-0405080 | 11/2003 |
| KR | 10-0406059 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 | 10/2005 |
| KR | 10-0532657 B1 | 12/2005 |
| KR | 10-2006-0008602 | 1/2006 |
| KR | 10-2006-0018745 | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |

(56) References Cited

FOREIGN PATENT DOCUMENTS

| | | |
|---|---|---|
| KR | 10-0696547 B1 | 3/2007 |
| KR | 10-0696550 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-0723627 B1 | 5/2007 |
| KR | 10-2007-0056190 A | 6/2007 |
| KR | 10-0726132 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 A | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 | 3/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 A | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 A | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0052828 A | 5/2009 |
| KR | 10-2009-0053417 A | 5/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 A | 9/2009 |
| KR | 10-2009-0098186 A | 9/2009 |
| KR | 10-2009-0107702 | 10/2009 |
| KR | 10-0922763 A | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |
| WO | WO2004016406 A1 | 2/2004 |
| WO | WO 2005/094130 A1 | 10/2005 |
| WO | 2008004792 A1 | 1/2008 |

OTHER PUBLICATIONS

SIPO Office action dated May 29, 2013, for Chinese Patent application 201010189614.0, (12 pages).
U.S. Office action dated Jun. 11, 2013, for cross reference U.S. Appl. No. 12/979,656, (50 pages).
KIPO Registration Determination Certificate dated Oct. 27, 2011, for Korean priority Patent application 10-2010-0002381, corresponding to cross reference U.S. Appl. No. 12/979,656, 5 pages.
U.S. Office action dated Dec. 13, 2011, for cross-reference U.S. Appl. No. 12/849,193, 30 pages.
KIPO Registration Determination Certificate dated Sep. 23, 2011, for Korean priority Patent application 10-2009-0055473, corresponding to cross reference U.S. Appl. No. 12/784,804, 5 pages.
KIPO Registration Determination Certificate dated Sep. 28, 2011, for Korean priority Patent application 10-2009-0052359, corresponding to cross reference U.S. Appl. No. 12/784,804, 5 pages.
KIPO Registration Determination Certificate dated Sep. 28, 2011, for Korean priority Patent application 10-2009-0045200, corresponding to cross reference U.S. Appl. No. 12/784,804, 5 pages.
KIPO Registration Determination Certificate dated Sep. 28, 2011, for Korean priority Patent application 10-2009-0045201, corresponding to cross reference U.S. Appl. No. 12/784,804, 5 pages.
SIPO Office action dated Nov. 28, 2012, for Chinese Patent application 201110029291.3, (11 pages).
European Search Report dated May 13, 2011, for European Patent application 11250019.4, 6 pages.
European Search Report dated May 20, 2011, for European Patent application 10251404.9, 12 pages.
European Search Report dated Sep. 6, 2010, for European Patent application 10250962.7, 5 pages.
Patent Abstracts of Japan, and English machine translation of Japanese Publication 2001-052862, 20 pages.
Patent Abstracts of Japan, and English machine translation of Japanese Publication 2003-003250, 25 pages.

(56) References Cited

OTHER PUBLICATIONS

Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.
Korean Patent Abstracts, Publication No. 1020050045619, dated May 17, 2005, for corresponding Korean Patent 10-0520159.
Korean Patent Abstracts, Publication No. 1020040062203, dated Jul. 7, 2002, for corresponding Korean Patent 10-0646160.
Korean Patent Abstracts, Publication No. 1020060101987, dated Sep. 27, 2006, for corresponding Korean Patent 10-0687007.
Korean Patent Abstracts, Publication No. 1020020056238, dated Jul. 10, 2002, for corresponding Korean Patent 10-0698033.
Korean Patent Abstracts, Publication No. 1020050078637, datedugust 5, 2005, for corresponding Korean Patent 10-0700466.
Korean Patent Abstracts, Publication No. 1020070025164, dated Mar. 8, 2007, for corresponding Korean Patent 10-0711885.
Korean Patent Abstracts, Publication No. 1020020034272, dated May 9, 2002, for corresponding Korean Patent 10-0726132.
Korean Patent Abstracts, Publication No. 1020060126267, dated Dec. 6, 2006, for corresponding Korean Patent 10-0797787.
English Abstract, Publication No. 1020080002189, dated Jan. 4, 2008, for corresponding Korean Patent 10-0800125.
Korean Patent Abstracts, Publication No. 1020070050793. dated May 16, 2007, for corresponding Korean Patent 10-0815265.
Korean Patent Abstracts, Publication No. 1020010062735, dated Jul. 7, 2001, for corresponding Korean Patent 10-0827760.
Korean Patent Abstracts, Publication No. 1020080038650, dated May 7, 2008, for corresponding Korean Patent 10-0839380.
KIPO Office action dated Jul. 1, 2011 for Korean Patent application 10-2009-0072111, 4 pages.
KIPO Office action dated Jun. 1, 2011 for Korean Patent application 10-2009-0050528, 4 pages.
Japanese Office action dated Jan. 22, 2013, for Japanese Patent application 2010-116470 (3 pages).
Japanese Office action dated Jan. 8, 2013, for Japanese Patent application 2011-000180, (3 pages).
Patent Abstracts of Japan, and English machine translation of Japanese Publication 2004-349101 (11 pages).
JPO Office action dated Mar. 19, 2013, for corresponding Japanese Patent application 2011-097909, (3 pages).
Japanese Office action for Patent Application No. 2011-097909, dated Jan. 28, 2014, 4 pages.
JPO Office action dated Feb. 25, 2014, for corresponding Japanese Patent application 2013128405, (3 pages).
Taiwan Office action dated Apr. 14, 2014, for corresponding Taiwanese Patent application 100114360, (20 pages).
European Search Report dated May 27, 2011 for European Application No. 10251514.5 (11 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 31, 2011, for Korean Patent application 10-2010-0014273, (5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
SIPO Certificate of Patent dated Aug. 14, 2013, for Chinese application 20100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated Oct. 9, 2012 for Chinese Application No. 201010266406.6 (6 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated May 9, 2014 for U.S. Appl. No. 13/194,759 (27 pages).

(56) References Cited

OTHER PUBLICATIONS

U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Dec. 16, 2013 for U.S. Appl. No. 14/054,536 (35 pages).
U.S. Office action dated Dec. 17,2012, issued to U.S. Appl. No. 12/873,556 (37 pages).
U.S. Office action dated Dec. 26,2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Patent No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19,2013, issued to U.S. Appl. No. 13/194,759 (36 pages).
U.S. Office action dated Mar. 22, 2013, issued to U.S. Appl. No. 12/987,569 (12 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages.).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2013 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20 pages).
US Office action dated Sep. 12, 2012, in U.S. Appl. No. 12/515,673 (26 pages).
JPO Office action issued Sep. 30, 2014 in JP Application No. 2011-097909, 2 pages.

\* cited by examiner

__US 8,894,458 B2__

THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

CLAIM OF PRIORITY

This application claims priority to and the benefit of Korean Patent Application No. 10-2010-0039496, filed on Apr. 28, 2010, and Korean Patent Application No. 10-2011-0031288, filed on Apr. 5, 2011, in the Korean Intellectual Property Office, the disclosure of both of which are incorporated herein in its entirety by reference.

BACKGROUND

1. Field

Embodiments of the present invention relate to a thin film deposition apparatus, a method of manufacturing an organic light-emitting display device by using the thin film is deposition apparatus, and an organic light-emitting display device manufactured by using the method.

2. Description of the Related Art

Organic light-emitting display devices have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer, and thus light is emitted. However, it is difficult to achieve high light-emission efficiency with such a structure, and thus intermediate layers, including an electron injection layer, an electron transport layer, a hole transport layer, a hole injection layer, or the like, are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5 G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a demand for improvement in these regards.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY

Embodiments according to the present invention provide a thin film deposition apparatus that may be easily manufactured, that may be simply applied to the manufacture of large-sized display devices on a mass scale, and that improves manufacturing yield and deposition efficiency, a method of manufacturing an organic light-emitting display device manufactured by using the thin film deposition apparatus, and an organic light-emitting display device manufactured by using the method.

According to an aspect of the present invention, there is provided a thin film deposition apparatus to produce a thin film on a substrate, the apparatus including a plurality of thin film deposition assemblies, each thin film deposition assembly includes a deposition source that includes a deposition material, the deposition source to discharge the deposition material, a deposition source nozzle unit arranged at a side of the deposition source and including a plurality of deposition source nozzles arranged in a first direction, a patterning slit sheet arranged opposite to the deposition source nozzle unit and having a plurality of patterning slits arranged in the first direction and a barrier plate assembly including a plurality of barrier plates arranged in the first direction, the barrier plate assembly being arranged between the deposition source nozzle unit and the patterning slit sheet, the barrier plate assembly to partition a space between the deposition source nozzle unit and the patterning slit sheet into a plurality of sub-deposition spaces, wherein the thin film deposition apparatus is separated from the substrate by a distance, the thin film deposition apparatus and the substrate are movable relative to each other, deposition material includes a material to produce the thin film selected from the group consisting of a red (R) emission layer, a green (G) emission layer, a blue (B) emission layer and a plurality of auxiliary layers.

The number of thin film deposition assemblies may be at least five, and deposition materials respectively arranged within the deposition sources of the at least five thin film deposition assemblies may include materials for forming the B emission layer, one of the auxiliary layers, the G emission layer, another of the auxiliary layers, and the R emission layer sequentially. The number of thin film deposition assemblies may be at least five, and deposition materials respectively arranged within the deposition sources of the at least five thin film deposition assemblies may include materials for forming the B emission layer, one of the auxiliary layers, the R emission layer, another of the auxiliary layers, and the G emission layer sequentially. The deposition materials may be respectively arranged within the deposition sources of the plurality of thin film deposition assemblies, and may be sequentially deposited on the substrate. One of the thin film deposition apparatus and the substrate may be movable relative to the other of the thin film deposition apparatus and the substrate along a plane parallel to a surface of the substrate on which the deposition materials are deposited. The patterning slit sheets of the plurality of thin film deposition assemblies may be smaller than the substrate. Deposition temperatures of the deposition sources of the plurality of thin film deposition assemblies may be individually controlled. The barrier plate assembly of each of the thin film deposition assemblies may form a flow path for the deposition materials being discharged from the deposition source. Each of the barrier plates may extend in a second direction that is substantially perpendicular to the first direction and may partition a space between the deposition source nozzle unit and the patterning slit sheet into the plurality of sub-deposition spaces.

Each of the barrier plate assemblies may include a first barrier plate assembly including a plurality of first barrier plates and a second barrier plate assembly including a plurality of second barrier plates. Each of the first barrier plates and each of the second barrier plates may extend in a second direction that is substantially perpendicular to the first direction and partition a space between the deposition source nozzle unit and the patterning slit sheet into a plurality of sub-deposition spaces.

According to another aspect of the present invention, there is provided a thin film deposition apparatus to produce a thin film on a substrate, the apparatus including a plurality of thin film deposition assemblies, each thin film deposition assembly may include a deposition source that includes a deposition material, the deposition source to discharge the deposition material, a deposition source nozzle unit arranged at a side of the deposition source and including a plurality of deposition source nozzles arranged in a first direction and a patterning slit sheet arranged opposite to the deposition source nozzle unit and having a plurality of patterning slits arranged in a second direction perpendicular to the first direction, wherein deposition is performed while one of the substrate and the thin film deposition apparatus is moved in the first direction relative to an other of the substrate and the thin film deposition apparatus, the deposition source, the deposition source nozzle unit, and the patterning slit sheet being integrally arranged as one body, and the deposition material includes a material that produces a thin film selected from the group consisting of a R emission layer, a G emission layer, a B emission layer and a plurality of auxiliary layers.

The deposition source, the deposition source nozzle unit, and the patterning slit sheet may be integrally connected as one body by a connection member. The connection member may form a flow path for of the deposition material. The connection member may seal a space between the deposition source nozzle unit arranged at the side of the deposition source and the patterning slit sheet. The thin film deposition apparatus may be separated from the substrate by a distance. The deposition material discharged from the thin film deposition apparatus may be continuously deposited on the substrate while one of the substrate and the thin film deposition apparatus is moved in the first direction relative to the other of the substrate and the thin film deposition apparatus. The plurality of deposition source nozzles may be tilted at an angle. The plurality of deposition source nozzles may include deposition source nozzles arranged in two rows extending in the first direction, and the deposition source nozzles in the two rows being tilted to face each other. The plurality of deposition source nozzles include deposition source nozzles arranged in two rows formed in the first direction, the deposition source nozzles of a row located at a first side of the patterning slit sheet are arranged to face a second side of the patterning slit sheet, and the deposition source nozzles of the other row located at the second side of the patterning slit sheet are arranged to face the first side of the patterning slit sheet.

According to yet another aspect of the present invention, there is provided a method of manufacturing an organic light-emitting display device by using a thin film deposition apparatus to form a thin film on a substrate, the method including arranging the substrate to be separated from the thin film deposition apparatus by a distance, and depositing a deposition material discharged from the thin film deposition apparatus onto the substrate while one of the thin film deposition apparatus and the substrate is moved relative to the other of the thin film deposition apparatus and the substrate, wherein the thin film deposition apparatus includes a plurality of thin film deposition assemblies, each of said thin film deposition assemblies includes a deposition source that includes a deposition material, the deposition source to discharge the deposition material, a deposition source nozzle unit arranged at a side of the deposition source and including a plurality of deposition source nozzles arranged in a first direction, a patterning slit sheet arranged opposite to the deposition source nozzle unit and having a plurality of patterning slits arranged in the first direction and a barrier plate assembly including a plurality of barrier plates arranged in the first direction, the barrier plate assembly being arranged between the deposition source nozzle unit and the patterning slit sheet, the barrier plate assembly to partition a space between the deposition source nozzle unit and the patterning slit sheet into a plurality of sub-deposition spaces, the deposition material may include a material to produce the to thin film selected from the group consisting of a red (R) emission layer, a green (G) emission layer, a blue (B) emission layer and a plurality of auxiliary layers.

According to yet another aspect of the present invention, there is provide a method of manufacturing an organic light-emitting display device by using a thin film deposition apparatus to form a thin film on a substrate, the method including arranging the substrate to be spaced apart from the thin film deposition apparatus by a distance and depositing a deposition material discharged from the thin film deposition apparatus onto the substrate while one of the thin film deposition apparatus and the substrate is moved relative to the other of the thin film deposition apparatus and the substrate, wherein the thin film deposition apparatus includes a plurality of thin film deposition assemblies, each of said thin film deposition assemblies includes a deposition source that includes a deposition material, the deposition source to discharge the deposition material, a deposition source nozzle unit arranged at a side of the deposition source and including a plurality of deposition source nozzles arranged in a first direction and a patterning slit sheet arranged opposite to the deposition source nozzle unit and having a plurality of patterning slits arranged in a second direction perpendicular to the first direction, wherein the deposition material may include a material that produces a thin film selected from the group consisting of a R emission layer, a G emission layer, a B emission layer and a plurality of auxiliary layers.

The deposition materials for respectively forming the B emission layer, one of the auxiliary layers, the G emission layer, another of the auxiliary layers, and the R emission layer may be respectively discharged from the plurality of thin film deposition assemblies, and may be sequentially deposited on the substrate. The deposition materials for respectively forming the B to emission layer, one of the auxiliary layers, the R emission layer, another of the auxiliary layers, and the G emission layer may be respectively discharged from the plurality of thin film deposition assemblies, and may be sequentially deposited on the substrate. The deposition materials respectively arranged within the deposition sources of the plurality of thin film deposition assemblies may be sequentially deposited on the substrate. The depositing of the deposition material onto the substrate further may include separately controlling deposition temperatures of the plurality of thin film deposition assemblies.

According to yet another aspect of the present invention, there is provided an organic light emitting display device manufactured by using a thin film deposition apparatus to form a thin film on a substrate, the method including arranging the substrate to be spaced apart from the thin film deposition apparatus by a distance and depositing a deposition material discharged from the thin film deposition apparatus onto the substrate while one of the thin film deposition apparatus and the substrate is moved relative to the other of the thin film deposition apparatus and the substrate, wherein the thin film deposition apparatus includes a plurality of thin film deposition assemblies, each of said thin film deposition assemblies includes a deposition source that includes a deposition material, the deposition source to discharge the deposition material, a deposition source nozzle unit arranged at a side of the deposition source and including a plurality of deposition source nozzles arranged in a first direction and a patterning slit sheet arranged opposite to the deposition source nozzle unit and having a plurality of patterning slits arranged in a second direction perpendicular to the first direction, wherein the deposition material may include a material that produces a thin film selected from the group consisting of a R emission layer, a G emission layer, a B emission layer and a plurality of auxiliary layers.

According to yet another aspect of the present invention, there is provided an organic light-emitting display device including a plurality of pixels, wherein each of the pixels includes a G sub-pixel that includes a G emission layer and a G auxiliary layer, a R sub-pixel that includes a R emission layer and a R auxiliary layer and a B sub-pixel that includes a B emission layer, the G auxiliary layer is arranged between the B emission layer and the G emission layer, and the R auxiliary layer is arranged between the G emission layer and the R emission layer. An end portion of the G auxiliary layer may overlap an end portion of the B emission layer, the G emission layer may be arranged on the G auxiliary layer. An end portion of the R auxiliary layer may overlap an end portion of the G emission layer, the R emission layer may be arranged on the R auxiliary layer. The B emission layer and the G emission layer may be separated from each other by a first distance, and the G emission layer and the R emission layer may be separated from each other by a second distance. The display may also include a substrate and a first electrode and a second electrode arranged opposite to each other, wherein the B, G, and R emission layers and the G and R auxiliary layers may be arranged between the first and second electrodes. The G auxiliary layer and the R auxiliary layer may have different thicknesses from each other.

According to still another aspect of the present invention, there is provide an organic light-emitting display device having a plurality of pixels, each of the pixels may include a G sub-pixel that includes a G emission layer and a G auxiliary layer, a R sub-pixel that includes a R emission layer and a R auxiliary layer and a B sub-pixel that includes a B emission layer, the R auxiliary layer may be arranged between the B emission layer and the R emission layer, and the G auxiliary layer may be arranged between the R emission layer and the G emission layer. An end portion of the R auxiliary layer may overlap an end portion of the B emission layer, the R emission layer may be arranged on the R auxiliary layer. An end portion of the G auxiliary layer may overlap an end portion of the R emission layer, the G emission layer may be arranged on the G auxiliary layer. The B emission layer and the R emission layer may be spaced apart by a first distance, the R emission layer and the G emission layer may be spaced apart by a second distance. The display may also include a substrate and a first electrode and a second electrode arranged opposite to each other, the B, G, and R emission layers and the G and R auxiliary layers may be arranged between the first and second electrodes. The G auxiliary layer and the R auxiliary layer may have different thicknesses from each other.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, a thin film deposition apparatus according to an embodiment of the present invention and a method of manufacturing an organic light-emitting display device by using the thin film deposition apparatus will be described in detail.

Figure 1:
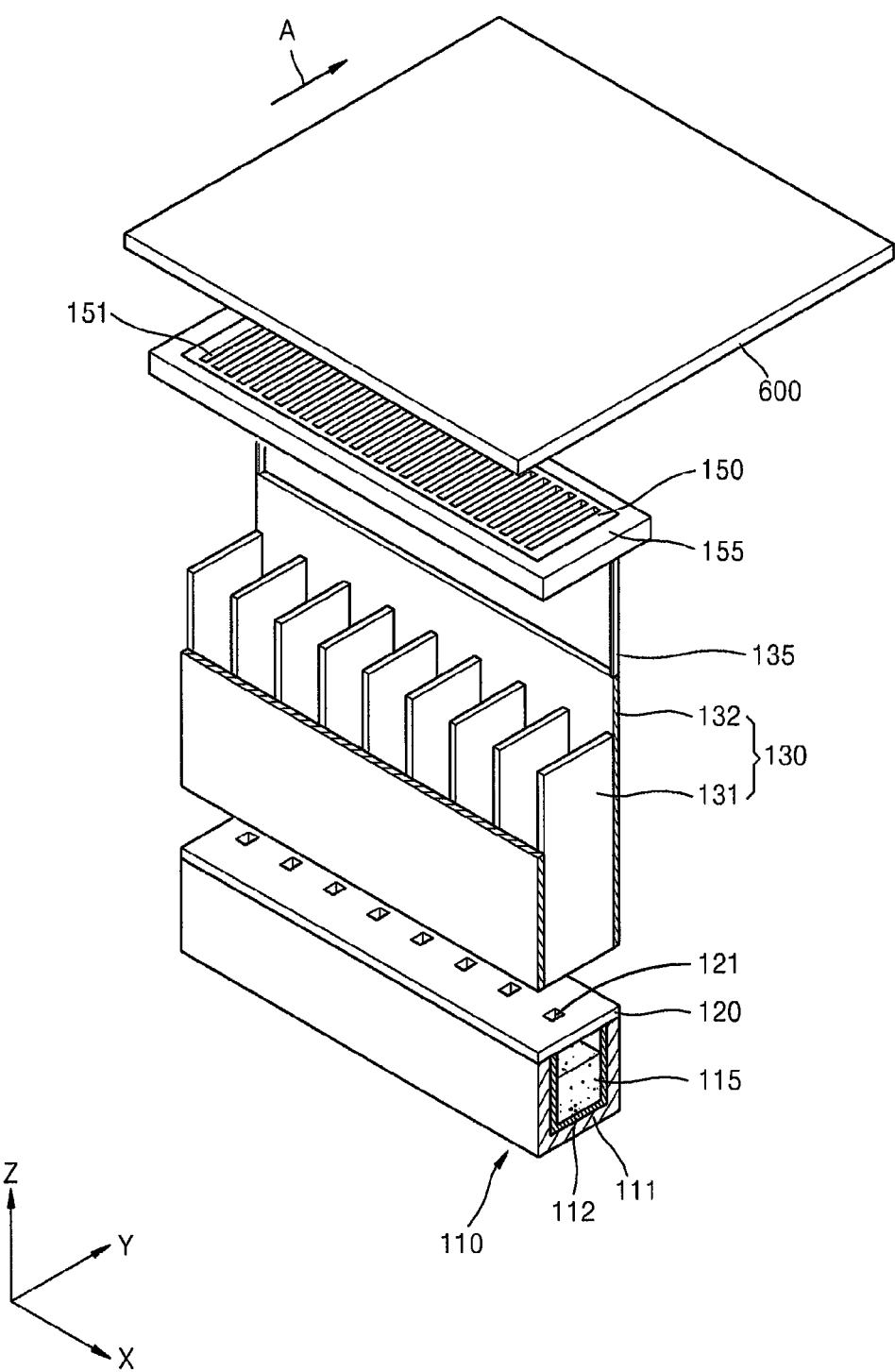
FIG. 1 is a schematic perspective view of a thin film deposition assembly according to a first embodiment of the present invention.
Figure 2:
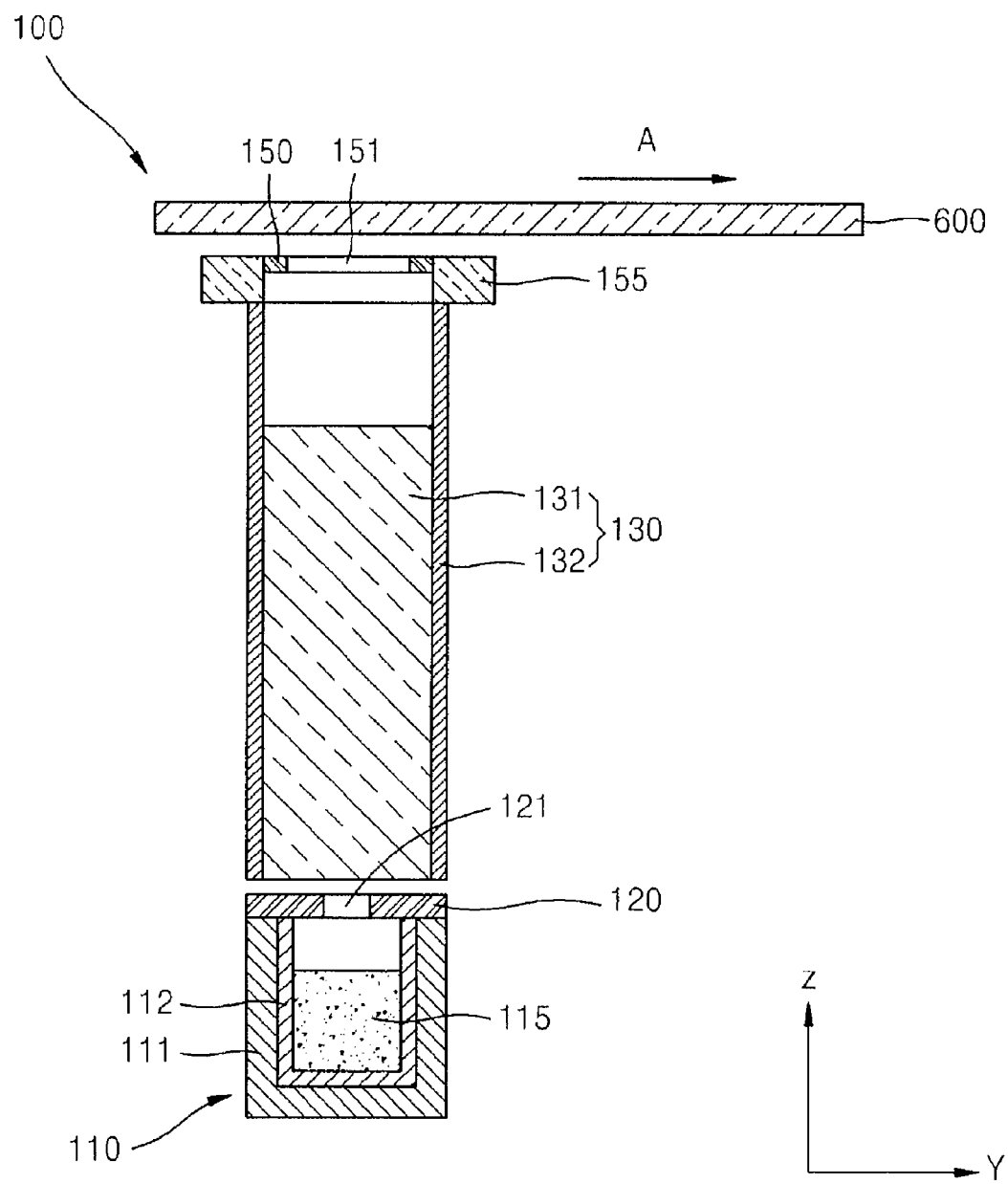
FIG. 2 is a schematic sectional view of the thin film deposition assembly illustrated in FIG. 1 according to the first embodiment of the present invention.
Figure 3:
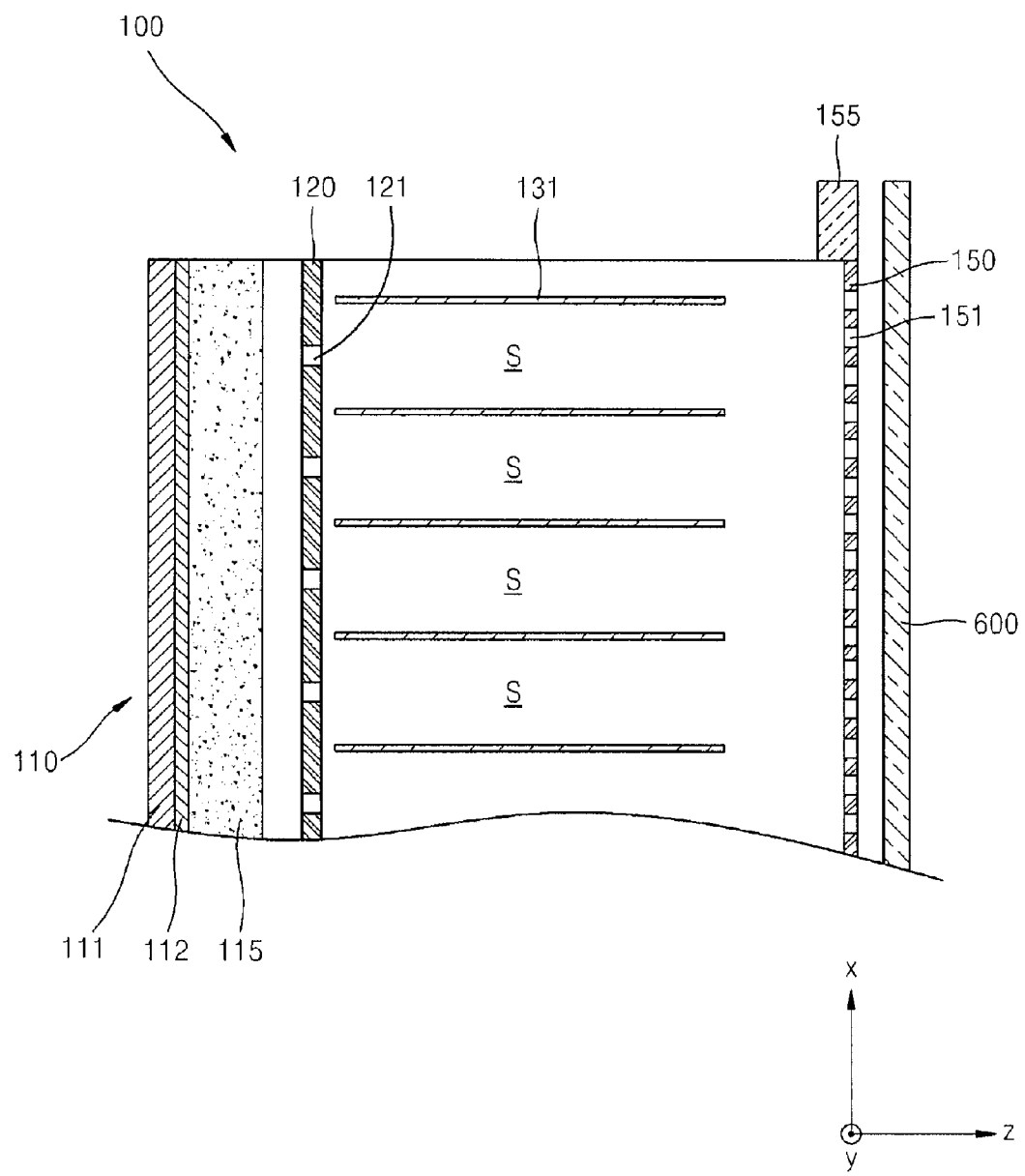
FIG. 3 is a schematic plan view of the thin film deposition assembly of FIG. 1.

Turning now to FIGS. 1 through 3, FIG. 1 is a schematic perspective view of a thin film deposition assembly 100 according to a first embodiment of the present invention, FIG. 2 is a schematic sectional view of the thin film deposition assembly 100 illustrated in FIG. 1, and FIG. 3 is a schematic plan view of the thin film deposition assembly 100 illustrated in FIG. 1.

Referring to FIGS. 1, 2 and 3, the thin film deposition assembly 100 according to the first embodiment of the present invention includes a deposition source 110, a deposition source nozzle unit 120, a barrier plate assembly 130, and a patterning slit sheet 150.

Although a chamber is not illustrated in FIGS. 1, 2 and 3 for the convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

In particular, in order to deposit a deposition material 115 that is emitted from the deposition source 110 and is discharged through the deposition source nozzle unit 120 and the patterning slit sheet 150 onto a substrate 600 in a desired pattern, it is required to maintain the chamber at a high-vacuum state as in a deposition method using a fine metal mask (FMM). In addition, the temperatures of barrier plates 131 and the patterning slit sheet 150 have to be sufficiently lower than the temperature of the deposition source 110. In this regard, the temperatures of the barrier plates 131 and the patterning slit sheet 150 may be about 100° C. or less. This is because the deposition material 115 that has collided with the barrier plates 131 may not be vaporized again when the temperature of the barrier plates 131 is sufficiently low. In addition, thermal expansion of the patterning slit sheet 150 may be reduced or minimized when the temperature of the patterning slit sheet 150 is sufficiently low. The barrier plate assembly 130 faces the deposition source 110 which is at a high temperature. In addition, the temperature of a portion of the barrier plate assembly 130 close to the deposition source 110 may rise by a maximum of about 167° C., and thus a partial-cooling apparatus may be further included if needed. To this end, the barrier plate assembly 130 may include a cooling member.

The substrate 600, which constitutes a deposition target on which a deposition material 115 is to be deposited, is disposed in the chamber. The substrate 600 may be a substrate for flat panel displays. A large substrate, such as a mother glass substrate, for manufacturing a plurality of flat panel displays, may be used as the substrate 160. Other substrates may also be employed.

In the first embodiment of the present invention, deposition may be performed while one of the substrate 600 and the thin film deposition assembly 100 is moved relative to the other of the substrate 600 and the thin film deposition assembly 100.

In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition assembly 100 according to the first embodiment of the present invention, deposition may be performed while one of the thin film deposition assembly 100 and the substrate 600 is moved relative to the other. In other words, deposition may be continuously performed while the substrate 600, which is disposed such as to face the thin film deposition assembly 100, is moved in a Y-axis direction. In other words, deposition is performed in a scanning manner while the substrate 600 is moved in a direction of arrow A in FIG. 1. Although the substrate 600 is illustrated as being moved in the Y-axis direction in FIG. 3 when deposition is performed, the present invention is not limited thereto. Deposition may instead be performed while the thin film deposition assembly 100 is moved in the Y-axis direction, while the substrate 600 is fixed.

Thus, in the thin film deposition assembly 100 according to the first embodiment of the present invention, the patterning slit sheet 150 may be significantly smaller than a FMM used in a conventional deposition method. In other words, in the thin film deposition assembly 100 according to the first embodiment of the present invention, deposition is continuously performed, i.e., in a scanning manner while the substrate 600 is moved in the Y-axis direction. Thus, lengths of the patterning slit sheet 150 in the X-axis and Y-axis directions may be significantly less than the lengths of the substrate 600 in the X-axis and Y-axis directions. As described above, since the patterning slit sheet 150 may be formed to be significantly smaller than a FMM used in a conventional deposition method, it is relatively easy to manufacture the patterning slit sheet 150 used in embodiments of the present invention. In other words, using the patterning slit sheet 150, which is smaller than a FMM used in a conventional deposition method, is more convenient in all processes, including etching and other subsequent processes, such as precise extension, welding, moving, and cleaning processes, compared to the conventional deposition method using the larger FMM. This is more suitable or advantageous for a relatively large display device.

In order to perform deposition while the thin film deposition assembly 100 or the substrate 600 is moved relative to the other as described above, the thin film deposition assembly 100 and the substrate 600 may be separated from each other (e.g., separated by a predetermined distance). This will be described later in detail.

The deposition source 110 that contains and heats the deposition material 115 is disposed at an opposite side of the chamber from the substrate 600. While the deposition material 115 contained within the deposition source 110 is vaporized, the deposition material 115 is deposited on the substrate 600.

In particular, the deposition source 110 includes a crucible 111 that is filled with the deposition material 115, and a heater 112 that heats the crucible 111 to vaporize the deposition material 115 arranged within the crucible 111, so as to move the vaporized deposition material 115 to the deposition source nozzle unit 120.

The deposition source nozzle unit 120 is disposed at a side of the deposition source 110 that faces the substrate 600. The deposition source nozzle unit 120 includes a plurality of deposition source nozzles 121 arranged at equal intervals in the X-axis direction. The deposition material 115 that is vaporized from the deposition source 110 passes through the deposition source nozzle unit 120 towards the substrate 600.

The barrier plate assembly 130 is disposed at a side of the deposition source nozzle unit 120 closest to substrate 600. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to a YZ plane in FIG. 3, i.e., perpendicular to the X-axis direction. The plurality of barrier plates 131 arranged as described above partitions the space between the deposition source nozzle unit 120 and the patterning slit sheet 150 into a plurality of sub-deposition spaces S (see FIG. 3). In the thin film deposition assembly 100 according to the first embodiment of the present invention, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and the deposition material 115 passes through the patterning slits 151 so as to be deposited on the substrate 600. In other words, the barrier plates 131 guide the deposition material 115, which is discharged through the deposition source nozzles 121, to move straight in the Z-axis direction and not to flow in the X-axis direction.

As described above, the deposition material 115 is forced to move straight by installing the barrier plates 131, so that a smaller shadow zone may be formed on the substrate 600 compared to a case where no barrier plates are present. Thus, the thin film deposition assembly 100 and the substrate 400 can be separated from each other (e.g., separated by a predetermined distance). This will be described later in detail.

The barrier plate frame 132, which forms upper and lower sides of the barrier plates 131, maintains the positions of the barrier plates 131, and guides the deposition material 115 discharged from the deposition source nozzles 121 so that the deposition material 115 does not flow in the Y-axis direction. In other words, the barrier plate frame 132 in the embodiment of FIG. 1 includes two opposing barrier frame plates that are spaced from each other along the Y-axis direction with the barrier plates 131 located therebetween. While the barrier frame plate on the left side in FIG. 1 appears as being less in height than the one on the right side, they may have the same height as illustrated in FIG. 2.

Although the deposition source nozzle unit 120 and the barrier plate assembly 130 are illustrated as being separated from each other by a predetermined distance, the present invention is not limited thereto. In order to prevent the heat emitted from the deposition source 110 from being conducted to the barrier plate assembly 130, the deposition source nozzle unit 120 and the barrier plate assembly 130 may be separated from each other (e.g., separated by a predetermined distance). Alternatively, if a heat insulator is disposed between the deposition source nozzle unit 120 and the barrier plate assembly 130, the deposition source nozzle unit 120 and the barrier plate assembly 130 may be bound together with the heat insulator therebetween.

In addition, the barrier plate assembly 130 may be constructed to be detachable from the thin film deposition assembly 100. A conventional FMM deposition technique has low deposition efficiency. Deposition efficiency refers to the ratio of a deposition material deposited on a substrate to the deposition material vaporized from a deposition source. The conventional FMM deposition technique has a deposition efficiency of about 32%. Furthermore, in the conventional FMM deposition technique, about 68% of organic deposition material that is not deposited on the substrate remains adhered to a deposition apparatus, and thus reusing the deposition material is not straightforward.

In order to overcome these problems, in the thin film deposition assembly 100 according to the first embodiment of the present invention, the deposition space is enclosed by using the barrier plate assembly 130, so that the portion of the deposition material 115 that fails to deposit on substrate 600 is mostly deposited on the barrier plate assembly 130. Thus, since the barrier plate assembly 130 is constructed to be detachable from the thin film deposition assembly 100, when a large amount of the deposition material 115 is attached to the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100 according to the first embodiment, a reuse rate of the deposition material 115 is increased, so that the deposition efficiency is improved and waste is reduced, thus reducing manufacturing costs.

The patterning slit sheet 150 and a frame 155 in which the patterning slit sheet 155 is bound are disposed between the deposition source 110 and the substrate 600. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The deposition material 115 that is vaporized in the deposition source 110, passes through the deposition source nozzle unit 120 and the patterning slit sheet 150 on the way to the substrate 600. The patterning slit sheet 150 may be manufactured by etching, which is the same method as used in a conventional technique of manufacturing an FMM, and in particular, a striped FMM.

In the thin film deposition assembly 100 according to the first embodiment of the present invention, the total number of patterning slits 151 may be greater than the total number of deposition source nozzles 121. In addition, there may be a greater number of patterning slits 151 than there are deposition source nozzles 121. In other words, at least one deposition source nozzle 121 may be disposed between each two adjacent barrier plates 131. Meanwhile, a plurality of patterning slits 151 (e.g., slits 151a and 151b shown in FIG. 2) may be disposed between each two adjacent barrier plates 131. The space between the deposition source nozzle unit 120 and the patterning slit sheet 150 is partitioned by the barrier plates 131 into sub-deposition spaces S that correspond to the deposition source nozzles 121, respectively. Thus, the deposition material 115 discharged from each of the deposition source nozzles 121 passes through a plurality of patterning slits 151 disposed in the sub-deposition space S corresponding to the deposition source nozzle 121, and is then deposited on the substrate 600.

In addition, the barrier plate assembly 130 and the patterning slit sheet 150 may be formed to be separated from each other (e.g., separated by a predetermined distance). Alternatively, the barrier plate assembly 130 and the patterning slit sheet 150 may be connected by a connection member 135. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other (e.g., separated by a predetermined distance).

As described above, the thin film deposition assembly 100 according to the first embodiment of the present invention performs deposition while being moved relative to the substrate 600. In order to move the thin film deposition assembly 100 relative to the substrate 600, the patterning slit sheet 150 is separated from the substrate 600 (e.g., separated by a predetermined distance). In addition, in order to prevent the formation of a relatively large shadow zone on the substrate 600 when the patterning slit sheet 150 and the substrate 600 are separated from each other, the barrier plates 131 are arranged between the deposition source nozzle unit 120 and the patterning slit sheet 150 to force the deposition material 115 to move in a straight direction. Thus, the size of the shadow zone that may be formed on the substrate 600 is sharply reduced.

In particular, in a conventional deposition technique using a FMM, deposition is performed with the FMM in close contact with a substrate in order to prevent formation of a shadow zone on the substrate. However, when the FMM is used in close contact with the substrate, the contact may cause defects. In addition, in the conventional deposition technique, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 100 according to the first embodiment of the present invention, the patterning slit sheet 150 is disposed to be separated from the substrate 600 (e.g., separated by a predetermined distance). This may be facilitated by installing the barrier plates 131 to reduce the size of the shadow zone formed on the substrate 600.

As described above, according to embodiments of the present invention, a mask is formed to be smaller than a substrate, and deposition is performed while the mask is moved relative to the substrate. Thus, the mask can be easily manufactured. In addition, defects caused due to the contact between a substrate and a FMM, which occur in the conventional deposition technique may be prevented. Furthermore, since it is unnecessary to dispose the FMM in close contact with the substrate during a deposition process, the manufacturing time may be reduced. As described above, the shadow zone formed on the substrate 600 may be reduced by installing the barrier plates 131. Thus, the patterning slit sheet 150 can be separated from the substrate 600.

Figure 4:
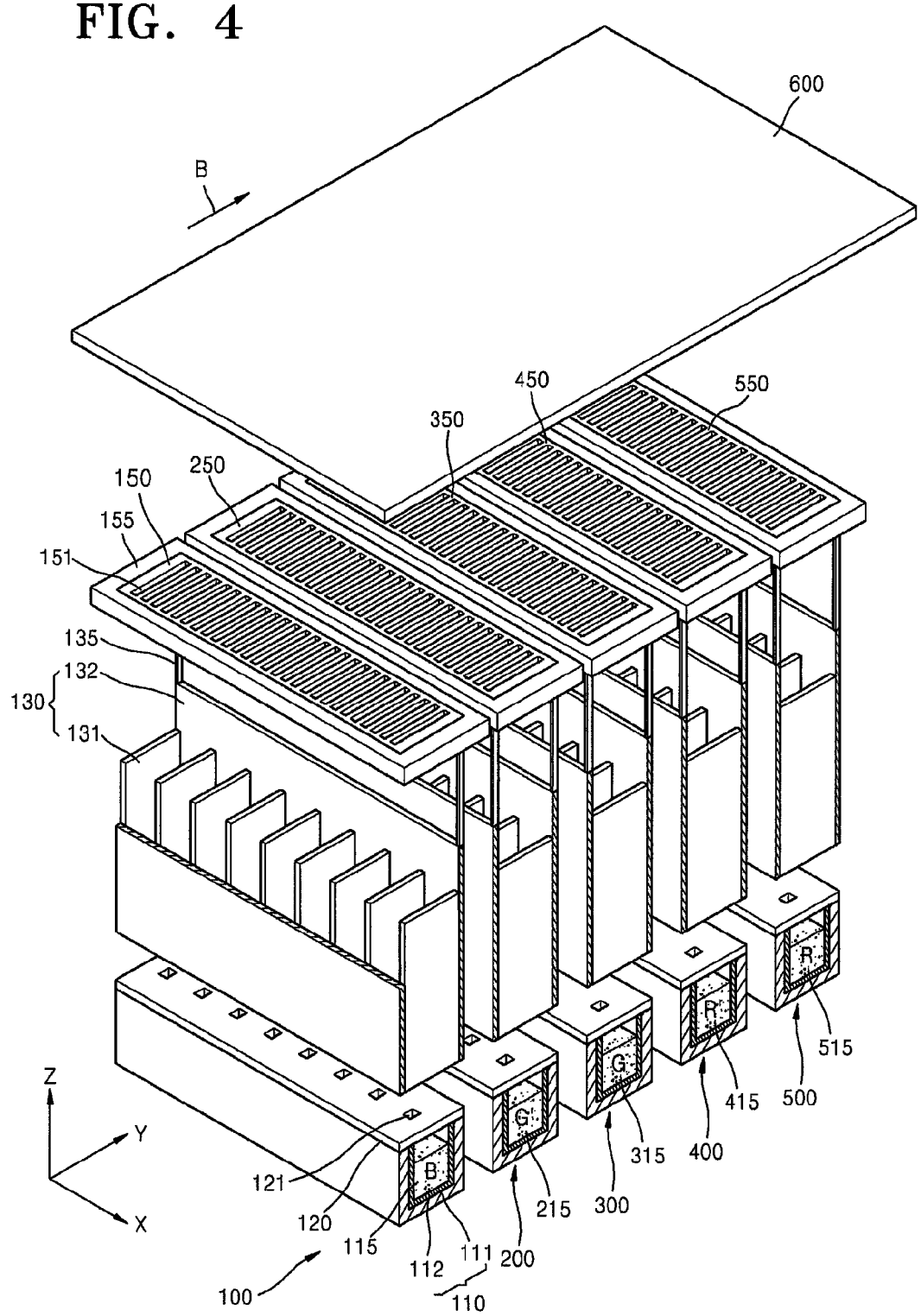
FIG. 4 is a schematic perspective view of a thin film deposition apparatus according to the first embodiment of the present invention.

Turning now to FIG. 4, FIG. 4 is a schematic perspective view of a thin film deposition apparatus according to an embodiment of the present invention. Referring to FIG. 4, the thin film deposition apparatus according to the current embodiment of the present invention includes a plurality of thin film deposition assemblies, each of which has the structure of the thin film deposition assembly 100 illustrated in FIGS. 1 through 3. In other words, the thin film deposition apparatus according to the current embodiment of the present invention may include a multi-deposition source that sequentially discharges deposition materials for forming a blue emission (B) layer, a green auxiliary (G') layer, a green (G) emission layer, a red auxiliary (R') layer, and a red (R) emission layer.

In particular, the thin film deposition apparatus according to the current embodiment of the present invention includes a first thin film deposition assembly 100, a second thin film deposition assembly 200, a third thin film deposition assembly 300, a fourth thin film deposition assembly 400, and a fifth thin film deposition assembly 500. Each of the first thin film deposition assembly 100, the second thin film deposition assembly 200, the third thin film deposition assembly 300, the fourth thin film deposition assembly 400, and the fifth thin film deposition assembly 500 has the same structure as the thin film deposition assembly described with reference to FIGS. 1 through 3, and thus a detailed description thereof will not be provided here.

The deposition sources 110 of the first thin film deposition assembly 100, the second thin film deposition assembly 200, the third thin film deposition assembly 300, the fourth thin film deposition assembly 400, and the fifth thin film deposition assembly 500 may contain different deposition materials, respectively.

For example, the first thin film deposition assembly 100 may contain a deposition material for forming a B emission layer, the second thin film deposition assembly 200 may contain a deposition material for forming a G' auxiliary layer, the third thin film deposition assembly 300 may contain a deposition material for forming a G emission layer, the fourth thin film deposition assembly 400 may contain a deposition material for forming a R' auxiliary layer, and the fifth thin film deposition assembly 500 may contain a deposition material for forming a R emission layer.

Alternatively and not shown in FIG. 4, the first thin film deposition assembly 100 may instead contain the deposition material for forming a B emission layer, the second thin film deposition assembly 200 may instead contain the deposition material for forming a R' auxiliary layer, the third thin film deposition assembly 300 may instead contain the deposition material for forming an R emission layer, the fourth thin film deposition assembly 400 may instead contain the deposition material for forming a G' auxiliary layer, and the fifth thin film deposition assembly 500 may instead contain the deposition material for forming a G emission layer.

Figure 5A:
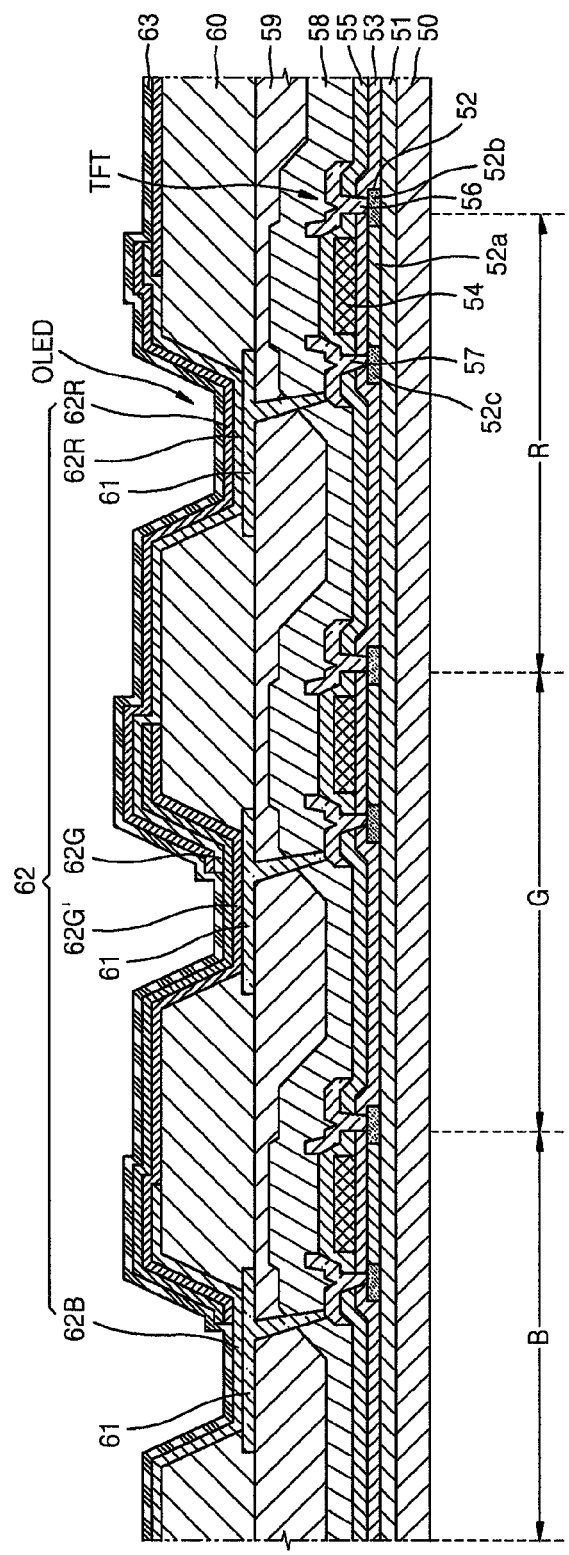
FIGS. 5A and 5B are sectional views of a pixel of an organic light-emitting display device manufactured by using the thin film deposition apparatus of FIG. 4.
Figure 5B:
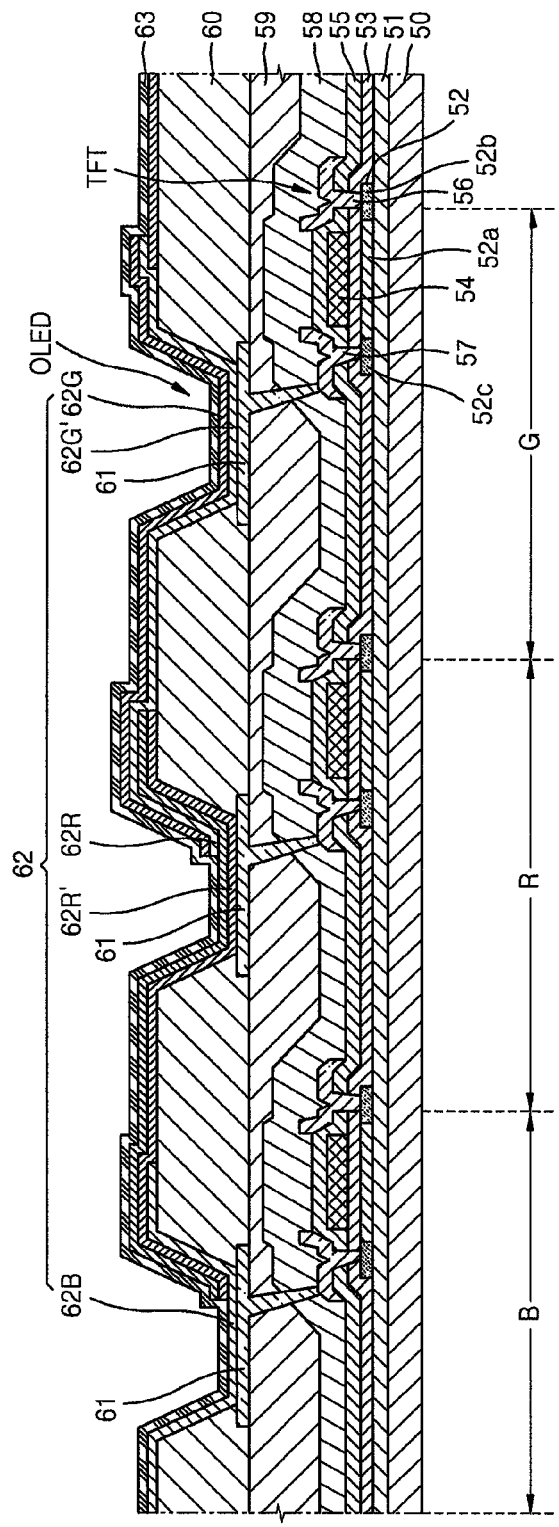

According to the above structure, the G' auxiliary layer (refer to 62G' of FIG. 5A) is disposed between the B emission layer (refer to 62B of FIG. 5A) and the G emission layer (refer to 62G of FIG. 5A), and the R' auxiliary layer (refer to 62R' of FIG. 5A) is disposed between the G emission layer (refer to 62G of FIG. 5A) and the R emission layer (refer to 62R of FIG. 5A). Alternatively, the R' auxiliary layer may be disposed between the B emission layer and the R emission layer, and the G' auxiliary layer may be disposed between the G emission layer and the R emission layer as shown in FIG. 5B. That is, since an intermediate layer is disposed between the two adjacent emission layers, the adjacent emission layers do not contact each other. This will be described later in detail with reference to FIG. 5A.

Here, the deposition materials for forming the R' and G' auxiliary layer, the deposition material for forming the R emission layer, the deposition material for forming the G emission layer, and the deposition material for forming the B emission layer may vaporize at different temperatures from each other. Thus, the temperatures of the deposition sources 110, 210, 310, 410, and 510 of the respective first, second, third, fourth, and fifth thin film deposition assemblies 100, 200, 300, 400, and 500 may be set to be different.

Although the thin film deposition apparatus according to the current embodiment of the present invention includes five thin film deposition assemblies, the present invention is not limited thereto. In other words, a thin film deposition apparatus according to another embodiment of the present invention may include a plurality of thin film deposition assemblies, each of which contains a different deposition material.

As described above, a plurality of thin films may be formed at the same time using a plurality of thin film deposition assemblies, and thus manufacturing yield and deposition efficiency are improved. In addition, the overall manufacturing process is simplified, and the manufacturing costs are reduced.

Organic layers (refer to the organic layer 62 in FIG. 5A) including the emission layer of an organic light-emitting display device may be formed with a thin film deposition apparatus having the structure described above. A method of manufacturing an organic light-emitting display device according to an embodiment of the present invention may include arranging the substrate 600 to be separated from the thin film deposition apparatus (e.g., separated by a predetermined distance); and depositing a deposition material discharged from the thin film deposition apparatus while moving the thin film deposition apparatus or the substrate 600 relative to the other. This will now be described in detail below.

Initially, the substrate 600 is arranged to be separated from the thin film deposition apparatus (e.g., separated by a predetermined distance). As described above, the thin film deposition apparatus according to an embodiment of the present invention may include patterning slit sheets 150, 250, 350, 450, and 550, each of which is smaller than the substrate 600, and thus may be relatively easily manufactured. Thus, deposition may be performed while either or both of the thin film deposition apparatus and the substrate 600 are moved relative to the other. In other words, deposition may be continuously performed while the substrate 600, which is arranged opposite to the thin film deposition apparatus, is moved in the Y-axis direction. In other words, deposition is performed in a scanning manner while the substrate 600 is moved in a direction of an arrow B in FIG. 4. In addition, the thin film deposition apparatus and the substrate 600 have to be separated from each other (e.g., separated by a predetermined distance) in order to move the thin film deposition apparatus or the substrate 600 relative to the other. For this reason, the substrate 600 is arranged in a chamber (not shown) and is separated from the thin film deposition apparatus (e.g., separated by a predetermined distance).

Next, a deposition material discharged from the thin film deposition apparatus is deposited on the substrate 600 while the thin film deposition apparatus or the substrate 600 is moved relative to the other. As described above, the thin film deposition apparatus according to an embodiment of the present invention may include the patterning slit sheets 150, 250, 350, 450, and 550, each of which is smaller than the substrate 600, and thus may be relatively easily manufactured. Thus, deposition is performed while the thin film deposition apparatus or the substrate 600 is moved relative to the other. Although FIGS. 1 and 4 illustrate that the substrate 600 is moved in the Y-axis direction while the thin film deposition apparatus is fixed, the present invention is not limited thereto. For example, the substrate 600 may instead be fixed and the thin film deposition apparatus may be moved relative to the substrate 600.

The thin film deposition apparatus for performing the method of manufacturing an organic light-emitting display device according to the current embodiment of the present invention may include a multi-deposition source that sequentially discharges deposition materials for forming the B emission layer, the G' auxiliary layer, the G emission layer, the R' auxiliary layer, and the R emission layer. Thus, a plurality of organic layers may be simultaneously formed. That is, the thin film deposition apparatus used to perform the method may include a plurality of thin film deposition assemblies, so that the B emission layer (refer to 62B of FIG. 5A), the G' auxiliary layer (refer to 62G' of FIG. 5A), the G emission layer (refer to 62G of FIG. 5A), the R' auxiliary layer (refer to 62R' of FIG. 5A), and the R emission layer (refer to 62R of FIG. 5A) may be formed at the same time with a single multi-deposition source. Thus, the time taken to manufacture the organic light-emitting display device is sharply reduced, and equipment costs are also markedly reduced since less chambers are needed.

Organic layers 62 of the organic light emitting display device that will be described later may be manufactured by the thin film deposition apparatus. In addition, the thin film deposition apparatus according to the current embodiment may be used to form organic layers or inorganic layers in an organic thin film transistor, and to form various films by using various materials.

Hereinafter, an organic light emitting display device manufactured by using the thin film deposition apparatus of FIG. 4 will be described in detail.

Turning now to FIGS. 5A and 5B, FIGS. 5A and 5B are a cross-sectional views of a pixel of the organic light-emitting display device manufactured by using the thin film deposition apparatus of FIG. 4. The pixel of FIG. 5B is substantially similar to the pixel of FIG. 5A, except that the locations of red and green sub-pixels are interchanged. Therefore, the description is provided below primarily in reference to FIG. 5A. Referring to FIG. 5A, a buffer layer 51 is formed on a substrate 50 made out of glass or plastic. A thin film transistor (TFT) and an organic light emitting diode (OLED) are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52a and 52c, respectively, of the active layer 52 through contact holes. A passivation layer 58 made out of $SiO_2$, $SiN_x$, or the like, is formed on the source/drain electrodes 56 and 57. A planarization layer 59 made out of an organic material, such as acryl, polyimide, benzocyclobutene (BCB), or the like, is formed on the passivation layer 58. A first electrode 61, which functions as an anode of the OLED, is formed on the planarization layer 59, and a pixel defining layer 60 made out of an organic material is formed on the first electrode 61. An opening is formed in the pixel defining layer 60, and an organic layer 62 is formed on a surface of the pixel defining layer 60 and on a surface of the first electrode 61 exposed through the opening. The organic layer 62 includes an emission layer. The present invention is not limited to the structure of the organic light-emitting display device described above, and various structures of organic light-emitting display devices may be applied to described embodiments of the present invention.

The OLED displays predetermined image information by emitting red, green or blue light as current flows. The OLED includes the first electrode 61, which is connected to the drain electrode 56 of the TFT and to which a positive power voltage is applied, a second electrode 63, which is formed so as to cover the entire sub-pixel and to which a negative power voltage is applied, and the organic layer 62, which is disposed between the first electrode 61 and the second electrode 63 to emit light. The first electrode 61 and the second electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic material. When a low-molecular weight organic layer is used, the organic layer 62 may have a single or multi-layer structure including at least one layer selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. The low-molecular weight organic layer may be formed by vacuum deposition. When including a high-molecular weight organic layer, the organic layer 62 may mostly have a structure including a HTL and an EML. In this case, the HTL may be made out of poly(ethylenedioxythiophene) (PEDOT), and the EML may be made out of polyphenylenevinylenes (PPVs) or polyfluorenes. The HTL and the EML may be formed by screen printing, inkjet printing, or the like. The organic layer 62 is not limited to the organic layers described above, and may be embodied in various other ways and still be within the scope of the present invention.

The first electrode 61 may function as an anode, and the second electrode 63 may function as a cathode. Alternatively, the first electrode 61 may function as a cathode, and the second electrode 63 may function as an anode.

The first electrode 61 may be a transparent electrode or a reflective electrode. Such a transparent electrode may be made out of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The second electrode 63 may be formed as a transparent electrode or a reflective electrode. When the second electrode 63 is formed as a transparent electrode, the second electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material such as ITO, IZO, ZnO, $In_2O_3$, or the like. When the second, electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 including the emission layer may be formed by using a thin film deposition apparatus 100 (see FIG. 1), which is described above. In more detail, the organic layer 62 may include emission layers 62R, 62G, and 62B and auxiliary layers 62R' and 62G'. According to the deposition materials used, the emission layers 62R, 62G, and 62B may emit red (R), green (G) and blue (B) color light, respectively. On the other hand, the auxiliary layers 62R' and 62G' are made out of the same material forming the HTL, an intermediate layer including the auxiliary layers 62R' and 62G' may be formed to be different in R, G, and B sub-pixels, which respectively emit red, green and blue light. This will now be described in detail below.

One of the first and second electrodes 61 and 63 is a reflective electrode and the other is a semi-transparent electrode or a transparent electrode. Thus, when the OLED is driven, resonance may occur between the first and second electrodes 61 and 63. Accordingly, when the organic light emitting display device is driven, the light emitted from the emission layers 62R, 62G, and 62B between the first and second electrodes 61 and 63 is resonated between the first and second electrodes 61 and 63 and emitted out of the organic light emitting display device. Thus, luminance and light emitting efficiency may be improved. In order to form the resonant structure, in the organic light-emitting display device manufactured using the thin film deposition apparatus according to the current embodiment, intermediate layer including the auxiliary layers 62R' and 62G' in R, G, and B sub-pixels which respectively emit red, green and blue light, may have different thicknesses. That is, since the auxiliary layers 62R' and 62G' in the organic layer 62 that is disposed between the first and second electrodes 61 and 63 have thicknesses that are optimized (or suitable) according to the emitted color of the emission layer, excellent driving voltage, high current density, high emission luminance, high color purity, high emitting efficiency, and superior lifespan characteristics may be obtained.

In a typical organic light emitting display device, the auxiliary layers 62R' and 62G' are generally formed on the first electrode 61, and then, the R emission layer 62R, the G emission layer 62G, and the B emission layer 62B are sequentially formed on the auxiliary layers. However, when the substrate and the patterning slit sheet are separated from each other like in the thin film deposition apparatus for forming an organic light emitting display device according to the current embodiment, there is a chance, however slight, that a shadow zone may be generated on the substrate. When the shadow zone is generated and the neighboring emission layers are mixed, the light emitting efficiency is degraded and the driving voltage is increased.

That is, as shown in following Table 1, an external quantum efficiency (EQE) of the B emission layer 62B in a normal state, that is, when there is no overlapping region, is 6.29%. However, the external quantum efficiency of the B emission layer is sharply reduced to 1.53% or 2.76% when only 1% of the R emission layer 62R or the G emission layer 62G overlaps the B emission layer 62B.

TABLE 1

| | Blue overlapped with 1% of R | Blue (normal) | Blue overlapped with 1% of G | Green (normal) | Green overlapped with 1% of R |
|---|---|---|---|---|---|
| EQE (%) | 1.53 | 6.29 | 2.76 | 12.29 | |
| Efficiency (cd/A) | 0.9 | 3.7 | 5.3 | 50.5 | 26.4 |
| Cx | 0.159 | 0.144 | 0.170 | 0.223 | 0.233 |
| Cy | 0.068 | 0.057 | 0.222 | 0.711 | |
| Peak wavelength (nm) | 456 | 456 | 455 | 529 | 529 |

In order to address the above problem, in the organic light emitting display device according to the current embodiment, sub-pixels in one pixel are arranged in an order of B, G, and R sub-pixels, an end portion of the G' auxiliary layer 62G' and an end portion of the G emission layer 62G overlap an end portion of the B emission layer 62B, and an end portion of the R' auxiliary layer 62R' and an end portion of the R emission layer 62R overlap the other end portion of the G emission layer 62G.

As described above, the first thin film deposition assembly 100 (see FIG. 4) contains the deposition material for forming the B emission layer 62B, the second thin film deposition assembly 200 (see FIG. 4) contains the deposition material for forming the G' auxiliary layer 62G', the third thin film deposition assembly 300 (see FIG. 4) contains the deposition material for forming the G emission layer 62G, the fourth thin film deposition assembly 400 (see FIG. 4) contains the deposition material for forming the R' auxiliary layer 62R', and the fifth thin film deposition assembly 500 (see FIG. 4) contains the deposition material for forming the R emission layer 62R.

In this case, the B emission layer 62B is formed first, and then, the G' auxiliary layer 62G' is formed. Here, a right end of the B emission layer 62B and a left end of the G' auxiliary layer 62G' overlap each other to some degree, and then the left end of the G' auxiliary layer 62G' is deposited on the right end of the B emission layer 62B. Next, the G emission layer 62G is formed on the G' auxiliary layer 62G'. That is, since the G' auxiliary layer 62G' is disposed between the B emission layer 62B and the G emission layer 62G, the adjacent B emission layer 62B and G emission layer 62G do not directly contact each other.

Next, the R' auxiliary layer 62R' is formed. At this time, the right end of the G emission layer 62G and the left end of the R' auxiliary layer 62R' overlap each other to some degree, and then, the left end of the R' auxiliary layer 62R' is deposited on the right end of the G emission layer 62G. After that, the R emission layer 62R is formed on the R' auxiliary layer 62R'. That is, since the R' auxiliary layer 62R' is disposed between the G emission layer 62G and the R emission layer 62R, the G emission layer 62G and the R emission layer 62R that are adjacent to each other do not directly contact each other.

As shown in Table 2, an external quantum efficiency of the B emission layer 62B in a normal state, that is, when there is no overlapping region, is 6.29%. In addition, an external quantum efficiency when the R' auxiliary layer and the R emission layer 62R overlap each other by about 1% is 5.78% and an external quantum efficiency when the G' auxiliary layer and the G emission layer 62G overlap each other by about 1% is 5.42%. That is, when compared with Table 1 in which the intermediate auxiliary layers are not disposed between the adjacent emission layers, the light emitting efficiency of the light emission layer is greatly improved, the color mixture does not occur, and the reproduction of color coordinates is improved.

overlap each other to some degree, and then, the left end of the G' auxiliary layer is deposited on the right end of the R emission layer. After that, a G emission layer is formed on the G' auxiliary layer. That is, since the G' auxiliary layer is disposed between the R emission layer and the G emission layer, the adjacent R emission layer and G emission layer do not directly contact each other.

According to the current embodiment, degradation of the light emitting efficiency and the color mixture generated due to the overlapping of adjacent emission layers may be reduced.

Figure 6:
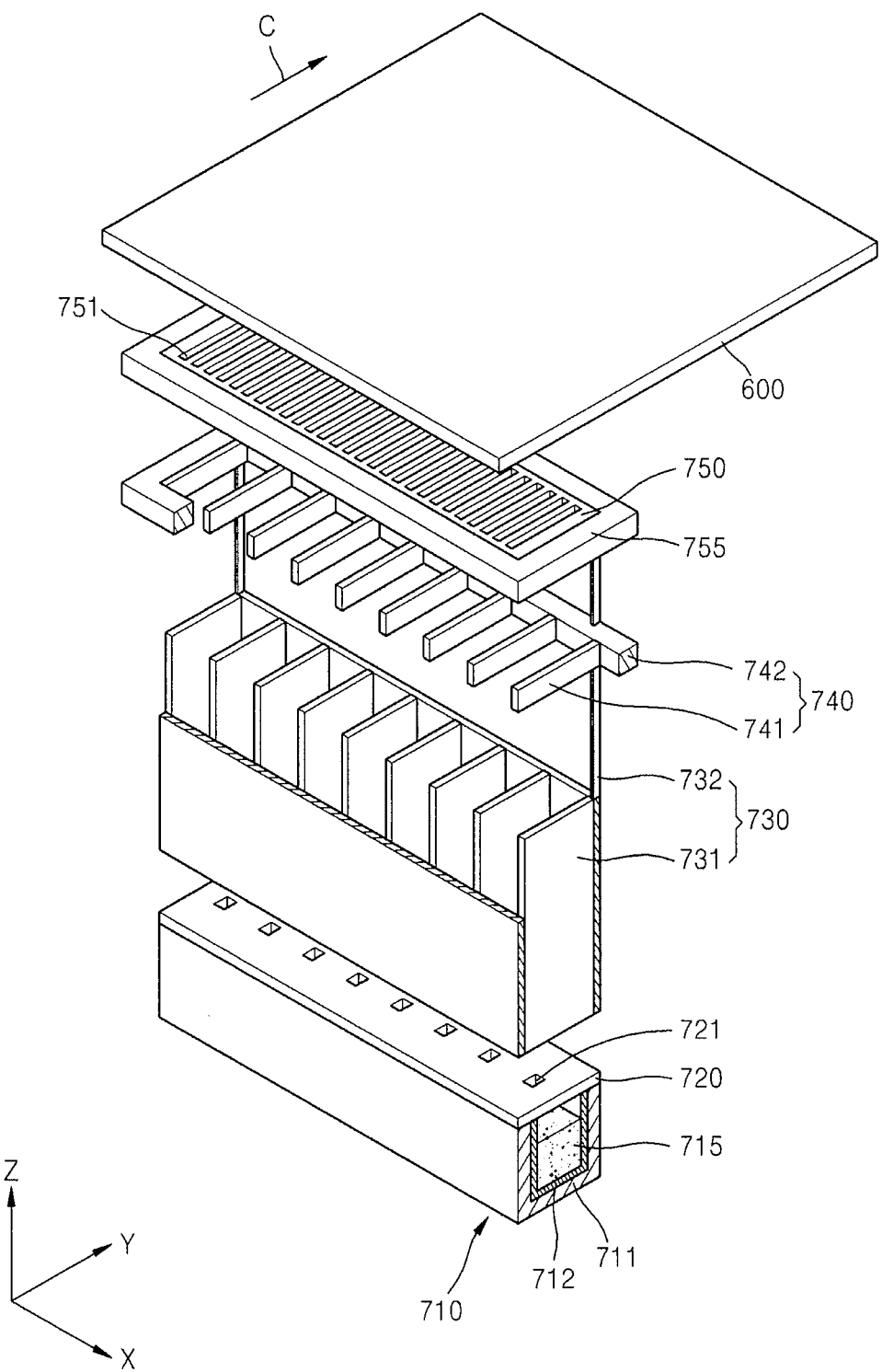
FIG. 6 is a schematic perspective view of a thin film deposition assembly according to a second embodiment of the present invention.

Turning now to FIG. 6, FIG. 6 is a schematic perspective view of a thin film deposition assembly 700 according to a second embodiment of the present invention. Referring to FIG. 6, the thin film deposition assembly 700 according to the second embodiment of the present invention includes a deposition source 710, a deposition source nozzle unit 720, a first barrier plate assembly 730, a second barrier plate assembly 740, and a patterning slit sheet 750, for depositing a deposition material on a substrate 600.

Although a chamber is not illustrated in FIG. 6 for the convenience of explanation, all the components of the thin film deposition assembly 700 may be disposed within a chamber that is maintained at an appropriate degree of vacuum. The chamber is maintained at an appropriate vacuum in order to allow a deposition material to move in a substantially straight line through the thin film deposition assembly 700.

TABLE 2

|  | Blue (overlapping R 1% and R' 1%) | Blue (normal) | Blue (overlapping G 1% and G' 1%) | Green (overlapping B 1%) | Green (normal) | Green (overlapping R 1%, R' 1%) | Red (overlapping G 1%) | Red (normal) | Red (overlapping B 1%) |
|---|---|---|---|---|---|---|---|---|---|
| EQE (%) | 5.78 | 6.29 | 5.42 | 11.83 | 12.29 | 10.29 | 26.34 | 27.86 | 28.19 |
| Efficiency (cd/A) | 3.5 | 3.7 | 3.3 | 49.6 | 50.5 | 43.6 | 23.6 | 33.2 | 32.9 |
| Cx | 0.140 | 0.144 | 0.142 | 0.238 | 0.223 | 0.252 | 0.688 | 0.677 | 0.679 |
| Cy | 0.060 | 0.057 | 0.059 | 0.702 | 0.711 | 0.693 | 0.304 | 0.310 | 0.310 |
| Peak wavelength (nm) | 457 | 456 | 456 | 531 | 529 | 533 | 640 | 629 | 629 |

Alternatively, although it is not shown in the drawings, the first thin film assembly 100 may contain the deposition material for forming the B emission layer, the second thin film assembly 200 may contain the deposition material for forming the R' auxiliary layer, the third thin film deposition assembly 300 may contain the deposition material for forming the R emission layer, the fourth thin film deposition assembly 400 may contain the deposition material for forming G' auxiliary layer, and the fifth thin film deposition material 500 may contain the deposition material for forming the G emission layer.

In this case, the B emission layer is formed first, and then, the R' auxiliary layer is then formed. Here, a right end of the B emission layer and a left end of the R' auxiliary layer overlap each other to some degree, and then, the left end of the R' auxiliary layer is deposited on the right end of the B emission layer. After that, the R emission layer is formed on the R' auxiliary layer. That is, the R' auxiliary layer is disposed between the B emission layer and the R emission layer, and thus the adjacent B emission layer and R emission layer do not directly contact each other.

Next, the G' auxiliary layer is formed. Here, a right end of the R emission layer and a left end of the G' auxiliary layer The substrate 600, which constitutes a deposition target on which a deposition material 115 is to be deposited, is disposed within the chamber. The deposition source 710 that contains and heats a deposition material 715 is disposed at an opposite side of the chamber to a side at which the substrate 600 is disposed. The deposition source 710 may include a crucible 711 and a heater 712.

The deposition source nozzle unit 720 is disposed at a side of the deposition source 710 facing the substrate 600. The deposition source nozzle unit 720 includes a plurality of deposition source nozzles 721 arranged at equal intervals in the X-axis direction.

The first barrier plate assembly 730 is disposed at a side of the deposition source nozzle unit 720. The first barrier plate assembly 730 includes a plurality of first barrier plates 731, and a first barrier plate frame 732 that covers sides of the first barrier plates 731. The first barrier plate frame 732 in the embodiment of FIG. 6 includes two opposing first barrier frame plates that are spaced from each other along the Y-axis direction with the first barrier plates 731 located therebetween. While the barrier frame plate on the left side in FIG. 6 appears as being less in height than the one on the right side, they may have the same height.

The second barrier plate assembly 740 is disposed at a side of the first barrier plate assembly 730. The second barrier plate assembly 740 includes a plurality of second barrier plates 741, and a second barrier plate frame 742 that covers sides of the second barrier plates 741.

The patterning slit sheet 750 and a frame 755, in which the patterning slit sheet 755 is bound, are disposed between the deposition source 710 and the substrate 600. The frame 755 may be formed in a lattice shape, similar to a window frame. The patterning slit sheet 750 includes a plurality of patterning slits 751 arranged in the X-axis direction, the patterning slits 751 extending in the Y-axis direction.

The thin film deposition assembly 700 according to the second embodiment of the present invention includes two separate barrier plate assemblies, i.e., the first barrier plate assembly 730 and the second barrier plate assembly 740.

The plurality of first barrier plates 731 may be arranged parallel to each other at equal intervals in the X-axis direction. In addition, each of the first barrier plates 731 may be formed to extend along a YZ plane in FIG. 10, i.e., perpendicular to the X-axis direction.

The plurality of second barrier plates 741 may be arranged parallel to each other at equal intervals in the X-axis direction. In addition, each of the second barrier plates 741 may be formed to extend parallel to the YZ plane in FIG. 710, i.e., perpendicular to the X-axis direction.

The plurality of first barrier plates 731 and second barrier plates 741 arranged as described above partition the space between the deposition source nozzle unit 720 and the patterning slit sheet 750. In the thin film deposition assembly 700 according to the second embodiment of the present invention, the deposition space is divided by the first barrier plates 731 and the second barrier plates 741 into sub-deposition spaces that respectively correspond to the deposition source nozzles 721 through which the deposition material 715 is discharged.

The second barrier plates 741 may be disposed to correspond respectively to the first barrier plates 731. In other words, the second barrier plates 741 may be respectively disposed to be parallel to and to be on the same plane as the first barrier plates 731. Each pair of the corresponding first and second barrier plates 731 and 741 may be located on the same plane. As described above, since the space between the deposition source nozzle unit 720 and the patterning slit sheet 750, which will be described later, is partitioned by the combination of the first barrier plates 731 and the second barrier plates 741, which are disposed parallel to each other, the deposition material 715 discharged through one of the deposition source nozzles 721 is not mixed with the deposition material 715 discharged through the other deposition source nozzles 721, and is deposited on the substrate 600 through the patterning slits 751. In other words, the first barrier plates 731 and the second barrier plates 741 guide the deposition material 715, which is discharged through the deposition source nozzles 721, and prevent the deposition material 715 from flowing in the X-axis direction.

Although the first barrier plates 731 and the second barrier plates 741 are respectively illustrated in FIG. 6 as having the same thickness in the X-axis direction, the present invention is not limited thereto. In other words, the second barrier plates 741, which need to be accurately aligned with the patterning slit sheet 750, may be formed to be relatively thin, whereas the first barrier plates 731, which do not need to be precisely aligned with the patterning slit sheet 750, may be formed to be relatively thick. This makes it easier to manufacture the thin film deposition assembly.

Although not illustrated, a thin film deposition apparatus according to the second embodiment of the present invention may include a plurality of thin film deposition assemblies as in FIG. 4, each of which has the structure illustrated in FIG. 6. In other words, the thin film deposition apparatus according to the second embodiment of the present invention may include a multi-deposition source that sequentially discharges deposition materials for forming a blue emission (B) layer, a green auxiliary (G') layer, a G emission layer, a red auxiliary (R') layer, and a R emission layer. Deposition is performed in a scanning manner while the substrate 600 is moved in a direction of an arrow C in FIG. 6. Since the plurality of thin film deposition assemblies have been described in detail in the first embodiment, a detailed description thereof will not be provided here.

Figure 7:
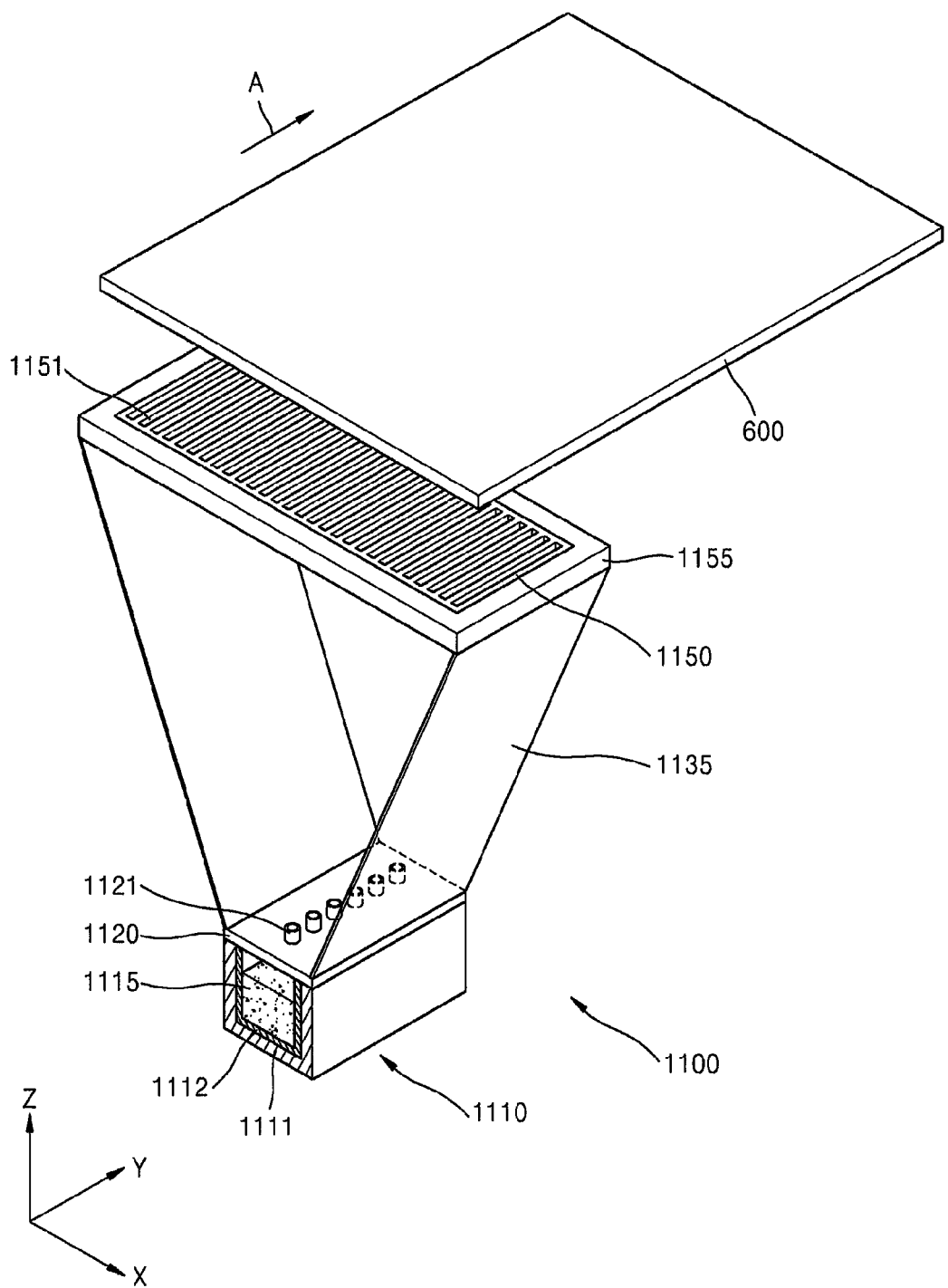
FIG. 7 is a schematic perspective view of a thin film deposition assembly according to a third embodiment of the present invention.
Figure 8:
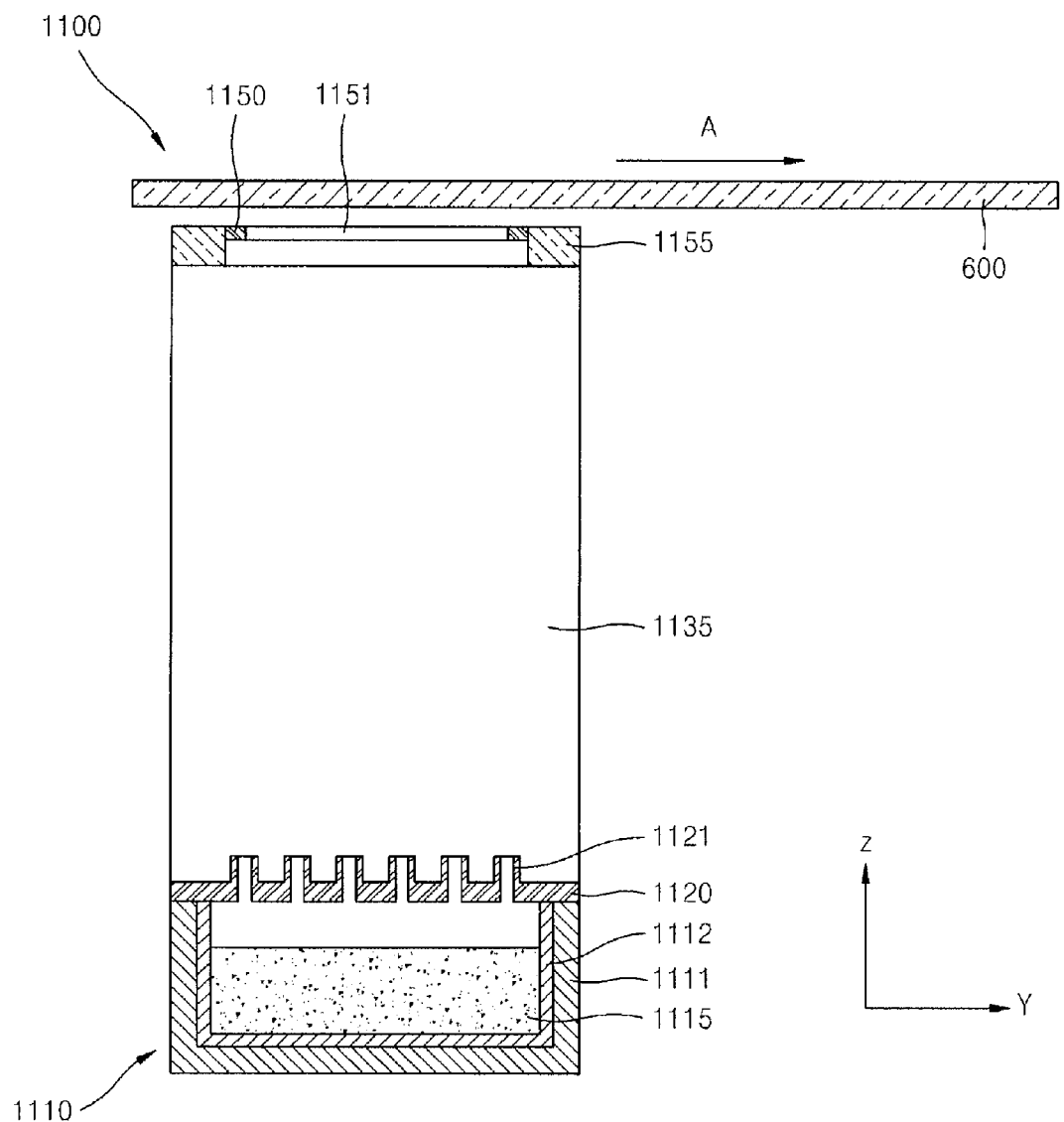
FIG. 8 is a schematic side view of the thin film deposition assembly of FIG. 7.
Figure 9:
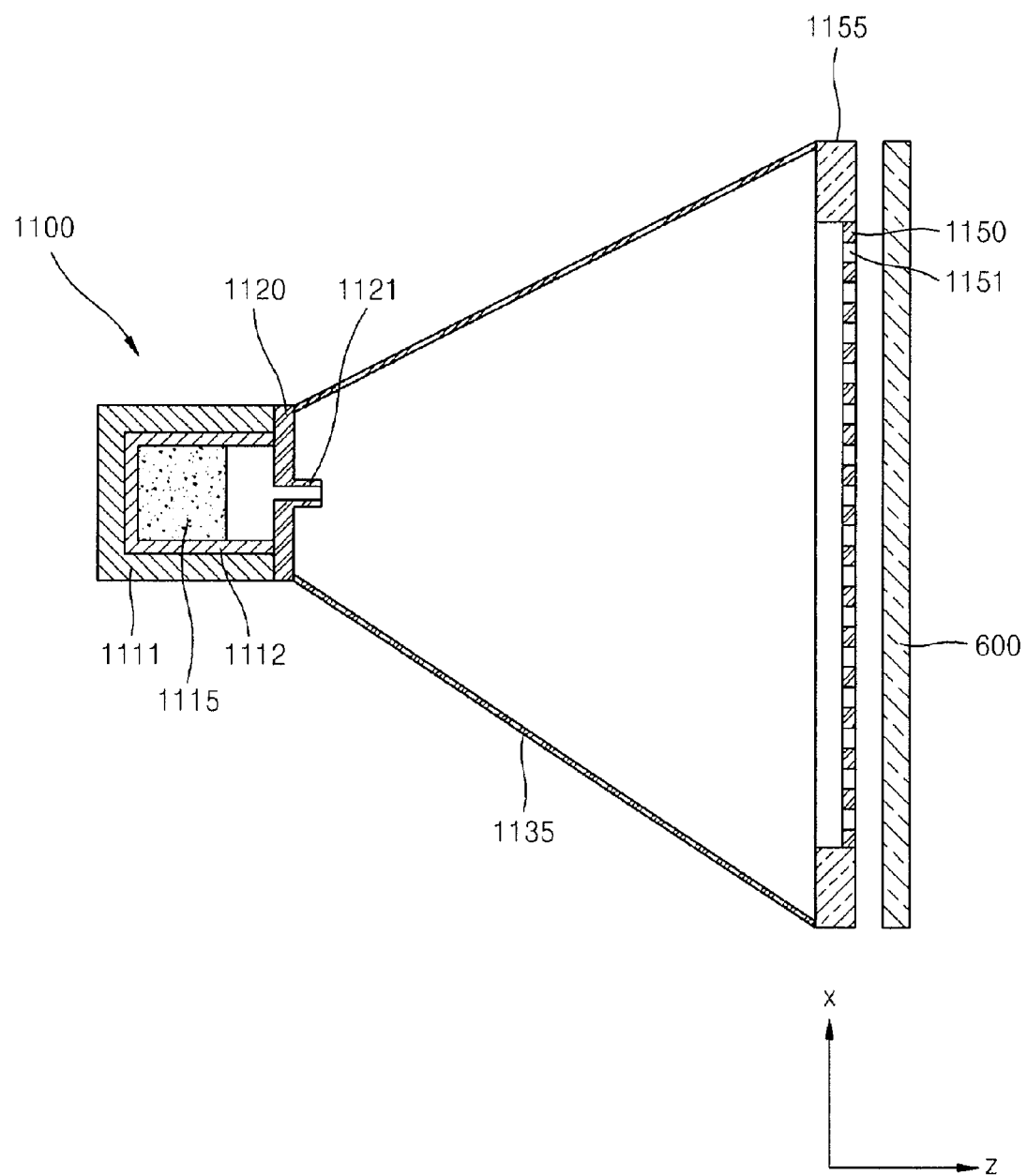
FIG. 9 is a schematic plan view of the thin film deposition assembly of FIG. 7.

Turning now to FIGS. 7 through 9, FIG. 7 is a schematic perspective view of a thin film deposition assembly 1100 according to a third embodiment of the present invention, FIG. 8 is a schematic sectional view of the thin film deposition assembly 1100 illustrated in FIG. 7, and FIG. 9 is a schematic plan view of the thin film deposition assembly 1100 illustrated in FIG. 7. Referring to FIGS. 7, 8 and 9, the thin film deposition assembly 1100 according to the third embodiment of the present invention includes a deposition source 1110, a deposition source nozzle unit 1120, and a patterning slit sheet 1150.

Although a chamber is not illustrated in FIGS. 7, 8 and 9 for the convenience of explanation, all the components of the thin film deposition assembly 1100 may be disposed within a chamber that is maintained at an appropriate degree of vacuum. The chamber is maintained at an appropriate vacuum in order to allow a deposition material to move in a substantially straight line through the thin film deposition assembly 1100.

The substrate 600, which constitutes a deposition target on which a deposition material 1115 is to be deposited, is disposed in the chamber. The deposition source 1110 that contains a crucible 1111 and a heater 1112 and heats the deposition material 1115, is disposed at an opposite side of the chamber to a side at which the substrate 600 is disposed.

The deposition source nozzle unit 1120 is disposed at a side of the deposition source 1110, and in particular, at the side of the deposition source 1110 facing the substrate 600. The deposition source nozzle unit 1120 includes a plurality of deposition source nozzles 1121 arranged at equal intervals in the Y-axis direction, i.e., a scanning direction of the substrate 600. The deposition material 1115 that is vaporized in the deposition source 1110 passes through the deposition source nozzle unit 1120 towards the substrate 600. As described above, when the deposition source nozzle unit 1120 includes the plurality of deposition source nozzles 1121 arranged in the Y-axis direction, that is, the scanning direction of the substrate 600, the size of a pattern made out of the deposition material discharged through the patterning slits 1150 of the patterning slit sheet 1151 is affected by the size of one of the deposition source nozzles 1121 (since there is only one line of deposition nozzles in the Y-axis direction), and thus no shadow zone may be formed on the substrate 600. In addition, since the plurality of deposition source nozzles 1121 are arranged in the scanning direction of the substrate 600, even if there is a is difference in flux between the deposition source nozzles 1121, the difference may be compensated for and deposition uniformity may be maintained constant.

The patterning slit sheet 1150 and a frame 1155 in which the patterning slit sheet 1155 is bound are disposed between the deposition source 1110 and the substrate 600. The frame 1155 may be formed in a lattice shape, similar to a window frame. The patterning slit sheet 1150 is bound inside the frame 1155. The patterning slit sheet 1150 includes a plurality of patterning slits 1151 arranged in the X-axis direction, each slit with openings that extend in the Y-axis direction. The deposition material 1115 that is vaporized in the deposition source 1110 passes through the deposition source nozzle unit 1120 and the patterning slit sheet 1150 towards the substrate 600. The patterning slit sheet 1150 may be manufactured by etching, which is the same technique as used in a conventional technique of manufacturing an FMM, and in particular, a striped FMM.

In addition, the deposition source 1110 and the deposition source nozzle unit 1120 coupled to the deposition source 1110 may be disposed to be separated from the patterning slit sheet 1150 (e.g., separated by a predetermined distance). Alternatively, the deposition source 1110 and the deposition source nozzle unit 1120 coupled to the deposition source 1110 may be connected to the patterning slit sheet 1150 by a connection member 1135. That is, the deposition source 1110, the deposition source nozzle unit 1120, and the patterning slit sheet 1150 may be integrally formed as one body by being connected to each other via the connection member 1135. The connection member 1135 guides the deposition material 1115, which is discharged through the deposition source nozzles 1121, to move straight in the Z-axis direction and not to flow in the X-axis direction. In FIG. 7, the connection members 1135 are formed on left and right sides of the deposition source 1110. The connection member 1135, the deposition source nozzle unit 1120 and the patterning slit sheet 1150 guide the deposition material 1115 to prevent deposition material 1115 from flowing in the X-axis direction, however, aspects of the present invention are not limited thereto. That is, the connection member 1135 may be formed as a sealed box to limit the flow of the deposition material 1115 both in the X-axis and Y-axis directions.

As described above, the thin film deposition assembly 1100 according to the third embodiment of the present invention performs deposition while being moved relative to the substrate 600. In order to move the thin film deposition assembly 1100 relative to the substrate 600, the patterning slit sheet 1150 must be spaced apart from the substrate 600 (e.g., spaced apart by a predetermined distance).

As described above, according to the described embodiments of the present invention, a mask is formed to be smaller than a substrate, and deposition is performed while the mask is moved relative to the substrate. Thus, the mask can be easily manufactured. In addition, defects caused due to contact between a substrate and a FMM, which occur in the conventional deposition technique, may be prevented. Furthermore, since it is unnecessary to dispose the FMM in close contact with the substrate during a deposition process, the manufacturing time may be reduced.

Although not illustrated, a thin film deposition apparatus according to the third embodiment of the present invention may include a plurality of thin film deposition assemblies as in FIG. 4, each of which has the structure illustrated in FIGS. 7 through 9. In other words, the thin film deposition apparatus according to the third embodiment of the present invention may include a multi-deposition source that sequentially discharges deposition materials for forming a blue emission (B) layer, a green auxiliary (G') layer, a G emission layer, a red auxiliary (R') layer, and a R emission layer. Deposition is performed in a scanning manner while the substrate 600 is moved in a direction of an arrow A in FIG. 7. Since the plurality of thin film deposition assemblies have been described in detail in the first embodiment, a detailed description thereof will not be provided here.

Figure 10:
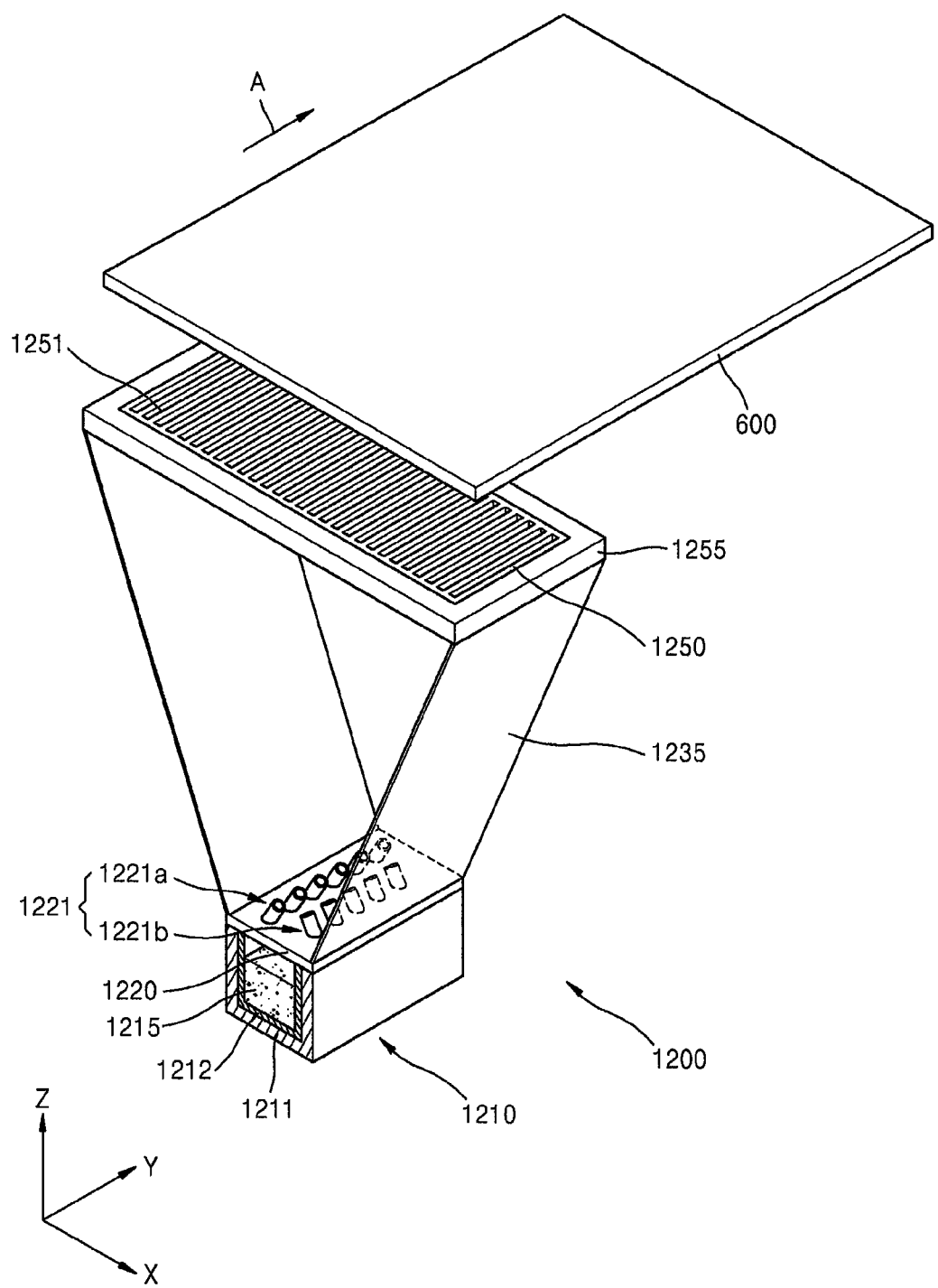
FIG. 10 is a schematic perspective view of a thin film deposition assembly according to a fourth embodiment of the present invention.

Turning now to FIG. 10, FIG. 10 is a schematic perspective view of a thin film deposition assembly 1200 according to a fourth embodiment of the present invention. Referring to FIG. 10, the thin film deposition assembly 1200 according to the current embodiment of the present invention includes a deposition source 1210, a deposition source nozzle unit 1220, and a patterning slit sheet 1250. In particular, the deposition source 1210 includes a crucible 1211 that is filled with the deposition material 1215, and a heater 1212 that heats the crucible 1211 to vaporize the deposition material 1215, which is contained in the crucible 1211, so as to move the vaporized deposition material 1215 to the deposition source nozzle unit 1220. The deposition source nozzle unit 1220, which has a planar shape, is disposed at a side of the deposition source 1210 closest to the substrate 600. The deposition source nozzle unit 1220 includes a plurality of deposition source nozzles 1221 arranged in the Y-axis direction. The patterning slit sheet 1250 and a frame 1255 are further disposed between the deposition source 1210 and the substrate 600. The patterning slit sheet 1250 includes a plurality of patterning slits 1251 arranged in the X-axis direction, each slit extending along the Y-axis direction. In addition, the deposition source 1210 and the deposition source nozzle unit 1220 may be connected to the patterning slit sheet 1250 by the connection member 1235.

In the fourth embodiment and unlike the third embodiment of FIGS. 7, 8, and 9, a plurality of deposition source nozzles 1221 formed in the deposition source nozzle unit 1220 are tilted (e.g., tilted at a predetermined angle). In particular, the deposition source nozzles 1221 may include deposition source nozzles 1221*a* and 1221*b* arranged in respective rows. The deposition source nozzles 1221*a* and 1221*b* may be arranged in respective rows to alternate in a zigzag pattern. The deposition source nozzles 1221*a* and 1221*b* may be tilted by a predetermined angle with respect to an YZ plane.

The deposition source nozzles 1221*a* of a first row and the deposition source nozzles 1221*b* of a second row may tilt to face each other. That is, the deposition source nozzles 1221*a* of the first row in a left part of the deposition source nozzle unit 1220 may tilt to face a right side portion of the patterning slit sheet 1250, and the deposition source nozzles 1221*b* of the second row in a right part of the deposition source nozzle unit 1220 may tilt to face a left side portion of the patterning slit sheet 1250.

Figure 11:
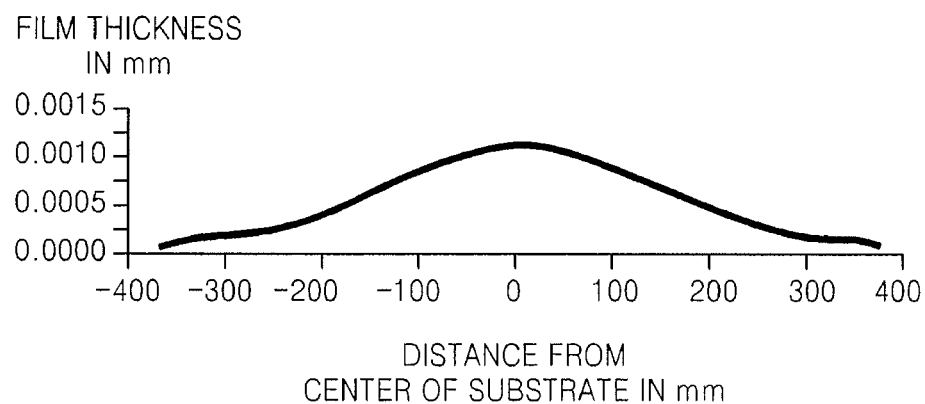
FIG. 11 is a graph schematically illustrating a distribution pattern of a deposition film formed on a substrate when a deposition source nozzle is not tilted in a thin film deposition assembly, according to the fourth embodiment of the present invention.
Figure 12:
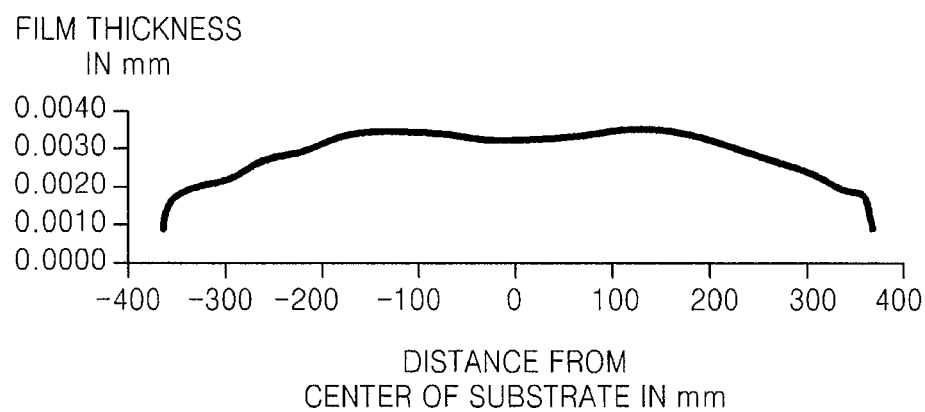
FIG. 12 is a graph schematically illustrating a distribution pattern of a deposition film formed on a substrate when a deposition source nozzle is tilted, in the thin film deposition assembly, according to the fourth embodiment of the present invention.

Turning now to FIGS. 11 and 12, FIG. 11 is a graph showing a distribution of a deposition film formed on the substrate 600 when the deposition source nozzles 1221*a* and 1221*b* are not tilted in the thin film deposition assembly 1200 according to the current embodiment of the present invention, and FIG. 12 is a graph showing a distribution of a deposition film formed on the substrate 600 when the deposition source nozzles 1221*a* and 1221*b* are tilted, in the thin film deposition assembly 1200. Comparing the graphs of FIGS. 11 and 12 with each other, the thickness of the deposition film formed on opposite end portions of the substrate 600 when the deposition source nozzles 1221*a* and 1221*b* are tilted is relatively greater than that of the deposition film formed on the substrate 600 when the deposition source nozzles 1221*a* and 1221*b* are not tilted, and thus, the uniformity of the deposition film is improved.

Due to the structure of the thin film deposition assembly 1200 according to the fourth embodiment, the deposition of the deposition material 1215 may be adjusted to lessen a thickness variation between the center and the end portions of the substrate 600 and improve thickness uniformity of the deposition film. Moreover, utilization efficiency of the deposition material 1215 may also be improved.

As described above, in a thin film deposition apparatus according to embodiments of the present invention, a method of manufacturing an organic light-emitting display device according to embodiments of the present invention by using the thin film deposition apparatus, and an organic light-emitting display device manufactured by using the technique, the thin film deposition apparatus may be simply applied to the manufacture of large-sized display devices on a mass scale. In addition, the thin film deposition apparatus and the organic-light-emitting to display device may be easily manufactured, and may improve manufacturing yield and deposition efficiency.

Instead of using a single fine metal mask (FMM) to produce the deposition pattern, a smaller patterning slit sheet is employed and moved relative to the substrate during deposition. Hence, in a large display, it is no longer necessary to use a very large FMM. Multiple deposition layers can be deposited in a single deposition step by having many deposition sources moving together. Auxiliary layers may be further included to prevent one color emission layer from directly contacting another color emission layer. Barrier plates may further be included between the patterning slit sheet and the deposition source to guide the evaporated deposition material while allowing for recovery of deposition material that fails to deposit. The nozzles may run parallel to or perpendicular to the slits of the patterning slit sheet. The nozzles may further be formed in two rows, each row having the nozzles tilted towards the other row to produce a more uniform deposition film.

Hereinafter, a composition of overall system of a thin film deposition apparatus comprising a plurality of thin film deposition assemblies of FIG. 4 will be described in detail. In other embodiments, the overall system of a thin film deposition apparatus may include any combination of the thin film deposition assemblies of FIG. 4, FIG. 6, FIG. 7 and or FIG. 10.

Figure 13:
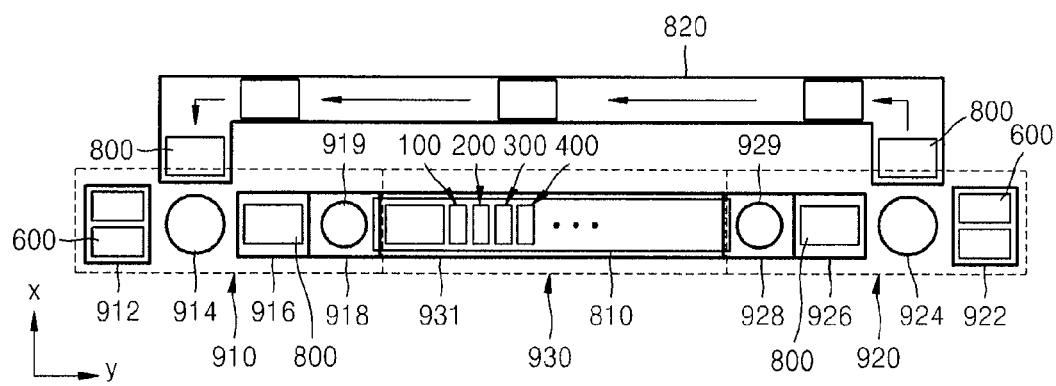
FIG. 13 is a schematic plan view of a thin film deposition apparatus according to an embodiment of the present invention.
Figure 14:
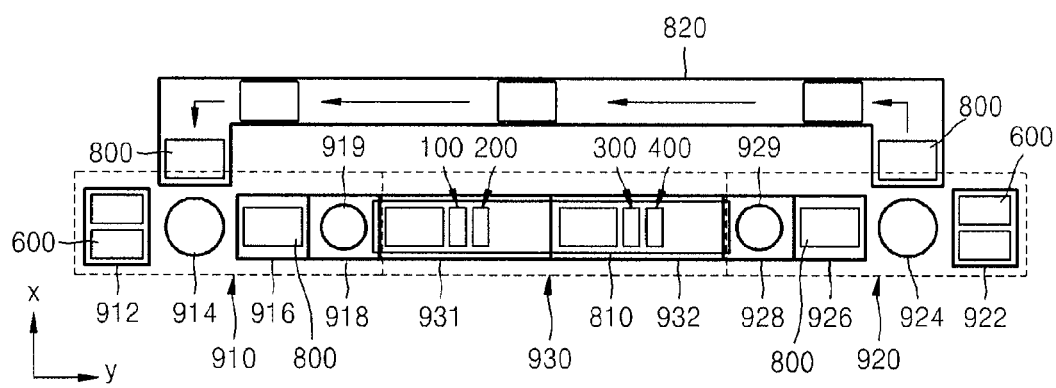
FIG. 14 is a schematic plan view of a modified example of the thin film deposition apparatus of FIG. 13.
Figure 15:
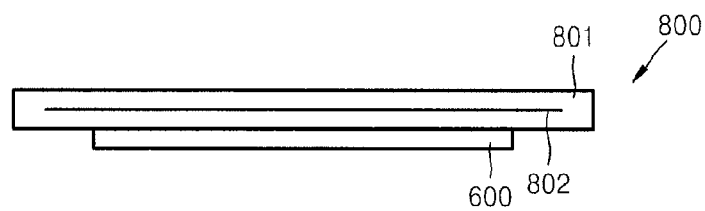
FIG. 15 is a cross-sectional view of an example of an electrostatic chuck of FIG. 13 according to an embodiment of the present invention.

FIG. 13 is a schematic plan view of a thin film deposition apparatus according to an embodiment of the present invention. FIG. 14 illustrates a modified example of the thin film deposition apparatus of FIG. 13. FIG. 15 is a cross-sectional view of an example of an electrostatic chuck 800 according to an embodiment of the present invention.

Referring to FIG. 13, the thin film deposition apparatus includes a loading unit 910, a deposition unit 930, an unloading unit 920, a first conveyer unit 810, and a second conveyer unit 820.

The loading unit 910 may include a first rack 912, a transport robot 914, a transport chamber 916, and a first inversion chamber 918. A plurality of substrates 600 onto which a deposition material is not applied are stacked up on the first rack 912. The transport robot 914 picks up one of the substrates 600 from the first rack 912, places the substrate 600 on the electrostatic chuck 800 transferred by the second conveyor unit 820, and moves the electrostatic chuck 800 on which the substrate 600 is placed into the transport chamber 916.

The first inversion chamber 918 is located adjacent to the transport chamber 916. The first inversion chamber 918 includes a first inversion robot 919 that inverts the electrostatic chuck 800 and then loads it into the first conveyer unit 810 of the deposition unit 930.

Referring to FIG. 15, the electrostatic chuck 800 may include an electrode 802 embedded in a main body 801 formed of ceramic, wherein the electrode 802 is supplied with power. The substrate 600 may be fixed to a surface of the main body 801 of the electrostatic chuck 800 as a high voltage is applied to the electrode 802.

Referring back to FIG. 13, the transport robot 914 places one of the substrates 600 on the surface of the electrostatic chuck 800, and the electrostatic chuck 800 on which the substrate 600 is placed is moved into the transport chamber 916. The first inversion robot 919 inverts the electrostatic chuck 800 so that the substrate 600 is turned upside down in the deposition unit 930.

The unloading unit 920 is constituted to operate in an opposite manner to the loading unit 910 described above. Specifically, a second inversion robot 929 in a second inversion chamber 928 inverts the electrostatic chuck 800, which has passed through the deposition unit 930 while the substrate 600 is placed on the electrostatic chuck 800, and then moves the electrostatic chuck 800 on which the substrate 600 is placed into an ejection chamber 926. Then, an ejection robot 924 removes the electrostatic chuck 800 on which the substrate 600 is placed from the ejection chamber 926, separates the substrate 600 from the electrostatic chuck 800, and then loads the substrate 600 into the second rack 922. The electrostatic chuck 800 separated from the substrate 600 is returned back into the loading unit 910 via the second conveyer unit 820.

However, aspects of embodiments according to the present invention are not limited to the above description. For example, when placing the substrate 600 on the electrostatic chuck 800, the substrate 600 may be fixed onto a bottom surface of the electrostatic chuck 800 and then moved into the deposition unit 930. In this case, for example, the first inversion chamber 918 and the first inversion robot 919, and the second inversion chamber 928 and the second inversion robot 929, may not be required.

The deposition unit 930 may include at least one deposition chamber. As illustrated in FIG. 13, the deposition unit 930 may include a first chamber 931. In this case, first to four thin film deposition assemblies 100, 200, 300, and 400 may be located in the first chamber 931. Although FIG. 13 illustrates that a total of four thin film deposition assemblies, i.e., the first to fourth thin film deposition assemblies 100 to 400, are installed in the first chamber 931, the total number of thin film deposition assemblies that may be installed in the first chamber 931 may vary according to a deposition material and deposition conditions. The first chamber 931 is maintained in a vacuum state during a deposition process.

In the thin film deposition apparatus illustrated in FIG. 14, a deposition unit 930 may include a first chamber 931 and a second chamber 932 that are connected to each other. In this case, first and second thin film deposition assemblies 100 and 200 may be located in the first chamber 931, and third and fourth thin film deposition assemblies 300 and 400 may be located in the second chamber 932. In other embodiments, additional chambers may be added, such that any suitable number of chambers may be used.

In the embodiment illustrated in FIG. 13, the electrostatic chuck 800 on which the substrate 600 is placed may be moved at least to the deposition unit 930 or may be moved sequentially to the loading unit 910, the deposition unit 930, and the unloading unit 920, by the first conveyor unit 810. The electrostatic chuck 800 that is separated from the substrate 600 in the unloading unit 920 is moved back to the loading unit 910 by the second conveyor unit 820.

While the present invention has been particularly shown and described with reference to exemplary embodiments thereof, it will be understood by those of ordinary skill in the art that various changes in form and details may be made thereto without departing from the spirit and scope of the present invention as defined by the following claims and their equivalents.

What is claimed is:

1. A method of manufacturing an organic light-emitting display device by using a thin film deposition apparatus to form a thin film on a substrate, the method comprising:

arranging the substrate to be separated from the thin film deposition apparatus by a distance; and depositing a deposition material discharged from the thin film deposition apparatus onto the substrate while one of the thin film deposition apparatus and the substrate is moved relative to the other of the thin film deposition apparatus and the substrate, wherein the thin film deposition apparatus comprises a plurality of thin film deposition assemblies, each of the plurality of thin film deposition assemblies comprising:

a deposition source that includes the deposition material, the deposition source to discharge the deposition material;

a deposition source nozzle unit arranged at a side of the deposition source and including a plurality of deposition source nozzles arranged in a first direction;

a patterning slit sheet arranged opposite to the deposition source nozzle unit and having a plurality of patterning slits arranged in the first direction; and a barrier plate assembly including a plurality of barrier plates arranged in the first direction, the barrier plate assembly being arranged between the deposition source nozzle unit and the patterning slit sheet, the barrier plate assembly to partition a space between the deposition source nozzle unit and the patterning slit sheet into a plurality of sub-deposition spaces;

wherein the deposition material includes a material selected from the group consisting of a red (R) emission layer, a green (G) emission layer, a blue (B) emission layer and a first auxiliary layer, and wherein the deposition materials respectively arranged within the deposition sources of the plurality of thin film deposition assemblies are sequentially deposited on the substrate.

2. A method of manufacturing an organic light-emitting display device by using a thin film deposition apparatus to form a thin film on a substrate, the method comprising:

arranging the substrate to be spaced apart from the thin film deposition apparatus by a distance; and depositing a deposition material discharged from the thin film deposition apparatus onto the substrate while one of the thin film deposition apparatus and the substrate is moved relative to the other of the thin film deposition apparatus and the substrate, wherein the thin film deposition apparatus comprises a plurality of thin film deposition assemblies, each of the plurality of thin film deposition assemblies comprising:

a deposition source that includes the deposition material, the deposition source to discharge the deposition material;

a deposition source nozzle unit arranged at a side of the deposition source and including a plurality of deposition source nozzles arranged in a first direction; and a patterning slit sheet arranged opposite to the deposition source nozzle unit and having a plurality of patterning slits arranged in a second direction perpendicular to the first direction, wherein the deposition material includes a material selected from the group consisting of a R emission layer, a G emission layer, a B emission layer and a first auxiliary layer, and wherein the deposition materials respectively arranged within the deposition sources of the plurality of thin film deposition assemblies are sequentially deposited on the substrate.

3. The method of claim 1, wherein the deposition materials for respectively forming the B emission layer, the first auxiliary layer, the G emission layer, a second auxiliary layer, and the R emission layer are respectively discharged from the plurality of thin film deposition assemblies, and are sequentially deposited on the substrate.

4. The method of claim 1, wherein the deposition materials for respectively forming the B emission layer, the first auxiliary layer, the R emission layer, a second auxiliary layer, and the G emission layer are respectively discharged from the plurality of thin film deposition assemblies, and are sequentially deposited on the substrate.

5. The method of claim 1, wherein the depositing of the deposition material onto the substrate further comprises separately controlling deposition temperatures of the plurality of thin film deposition assemblies.

6. An organic light-emitting display device manufactured according to the method of claim 1.

7. The method of claim 2, wherein the deposition materials for respectively forming the B emission layer, the first auxiliary layer, the G emission layer, a second auxiliary layer, and the R emission layer are respectively discharged from the plurality of thin film deposition assemblies, and are sequentially deposited on the substrate.

8. The method of claim 2, wherein the deposition materials for respectively forming the B emission layer, the first auxiliary layer, the R emission layer, a second auxiliary layer, and the G emission layer are respectively discharged from the plurality of thin film deposition assemblies, and are sequentially deposited on the substrate.

9. The method of claim 2, wherein the depositing of the deposition material onto the substrate further comprises separately controlling deposition temperatures of the plurality of thin film deposition assemblies.

10. An organic light-emitting display device manufactured according to the method of claim 2.

11. The method of claim 1, wherein at least one deposition source including a material for forming the first auxiliary layer is arranged between the deposition source and another deposition source, each of which including the material for forming the B emission layer, the G emission layer, or the R emission layer.

12. The method of claim 1, wherein at least one deposition material for forming the first auxiliary layer is deposited between at least two deposition materials for forming the emission layers.

13. The method of claim 1, wherein one of the thin film deposition apparatus and the substrate is movable relative to the other of the thin film deposition apparatus and the substrate along a plane parallel to a surface of the substrate on which the deposition materials are deposited.

14. The method of claim 1, wherein the patterning slit sheets of the plurality of thin film deposition assemblies are smaller than the substrate.

15. The method of claim 2, wherein at least one deposition source including a material for forming the first auxiliary layer is arranged between the deposition source and another deposition source, each of which including the material for forming the B emission layer, the G emission layer, or the R emission layer.

16. The method of claim 2, wherein at least one deposition material for forming the first auxiliary layer is deposited between at least two deposition materials for forming the emission layers.

17. The method of claim 2, wherein one of the thin film deposition apparatus and the substrate is movable relative to the other of the thin film deposition apparatus and the substrate along a plane parallel to a surface of the substrate on which the deposition materials are deposited.

18. The method of claim 2, wherein the patterning slit sheets of the plurality of thin film deposition assemblies are smaller than the substrate.

* * * * *